(12) United States Patent
Zhang et al.

(10) Patent No.: US 11,837,541 B2
(45) Date of Patent: Dec. 5, 2023

(54) MEMORY DEVICE AND FABRICATION METHOD THEREOF

(71) Applicant: Yangtze Memory Technologies Co., Ltd., Wuhan (CN)

(72) Inventors: Zhong Zhang, Wuhan (CN); Kun Zhang, Wuhan (CN); Wenxi Zhou, Wuhan (CN); Zhiliang Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 590 days.

(21) Appl. No.: 17/093,170

(22) Filed: Nov. 9, 2020

(65) Prior Publication Data

US 2022/0115322 A1    Apr. 14, 2022

Related U.S. Application Data

(63) Continuation of application No. PCT/CN2020/120022, filed on Oct. 9, 2020.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76816* (2013.01); *H01L 21/76877* (2013.01);
(Continued)

(58) Field of Classification Search
None
See application file for complete search history.

(56) References Cited

U.S. PATENT DOCUMENTS 9,000,563 B2    4/2015    Park et al.
9,224,747 B2    12/2015    Mizutani et al.
(Continued)

FOREIGN PATENT DOCUMENTS

CN    110176461 A    8/2019
CN    111108600 A    5/2020
(Continued)

OTHER PUBLICATIONS

The World Intellectual Property Organization (WIPO) International Search Report for PCT/CN2020/120022 dated Jun. 24, 2021 4 pages.

*Primary Examiner* — Alexander G Ghyka
(74) *Attorney, Agent, or Firm* — ANOVA LAW GROUP, PLLC

(57) ABSTRACT

A memory device includes a substrate; and a stack structure, including alternately arranged first dielectric layers and electrode layers. In a first lateral direction, the memory device includes an intermediate region and array regions. In a second lateral direction, the stack structure includes a first block and a second block, each including a wall-structure region. In the intermediate region, wall-structure regions of the first block and the second block are separated by a staircase structure. The memory device further includes a beam structure, located in the intermediate region and including at least a plurality of discrete first beam structures, each extending along the second lateral direction and connecting the wall-structure regions of the first block and the second block; and a plurality of second dielectric layers, located in the beam structure. In the first beam structures, the second dielectric layers is alternated with the first dielectric layers.

20 Claims, 24 Drawing Sheets

(51) Int. Cl.
- *H01L 23/522* (2006.01)
- *H10B 41/10* (2023.01)
- *H10B 41/27* (2023.01)
- *H10B 43/10* (2023.01)
- *H10B 43/27* (2023.01)

(52) U.S. Cl.
CPC ......... *H01L 23/5226* (2013.01); *H10B 41/10* (2023.02); *H10B 41/27* (2023.02); *H10B 43/10* (2023.02); *H10B 43/27* (2023.02)

(56) References Cited

U.S. PATENT DOCUMENTS

| | | |
|---|---|---|
| 10,593,690 B2 | 3/2020 | Lu et al. |
| 10,658,378 B2 | 5/2020 | Tao et al. |
| 2016/0322381 A1 | 11/2016 | Liu et al. |
| 2018/0047744 A1* | 2/2018 | Utsumi ............... H01L 24/16 |
| 2020/0395376 A1 | 12/2020 | Huo et al. |
| 2020/0411542 A1* | 12/2020 | Yang ................ H10B 41/50 |
| 2022/0109002 A1* | 4/2022 | Gupta ................ H10B 43/10 |
| 2022/0165747 A1* | 5/2022 | Yang ................ H10B 41/10 |

FOREIGN PATENT DOCUMENTS

| | | |
|---|---|---|
| CN | 111223867 A | 6/2020 |
| CN | 111566813 A | 8/2020 |
| TW | I694594 B | 5/2020 |

\* cited by examiner

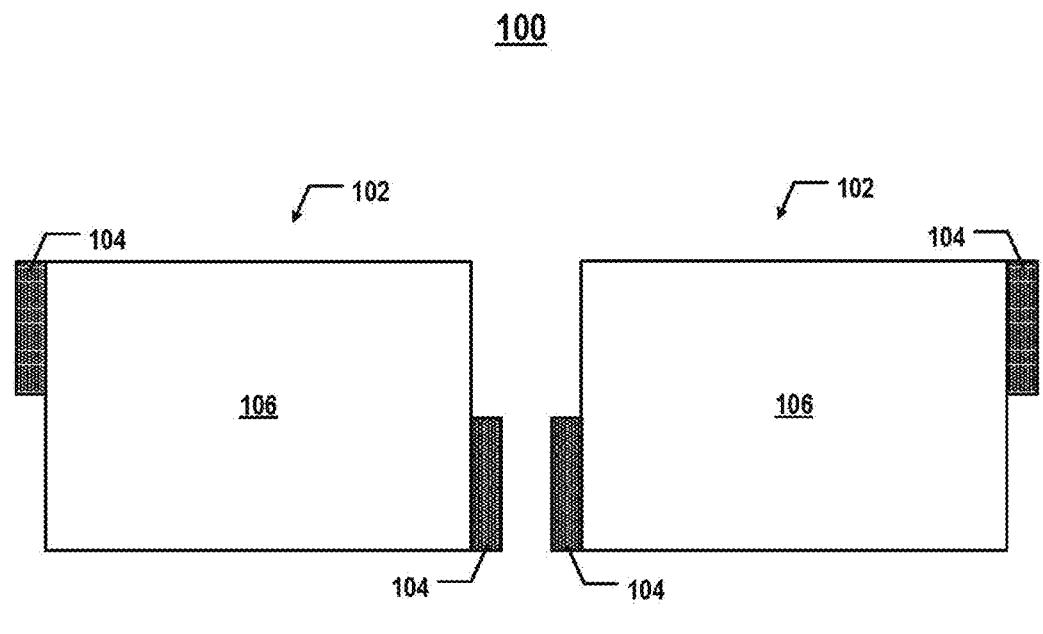
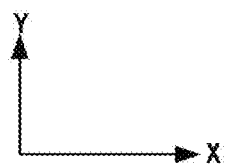
FIG. 1

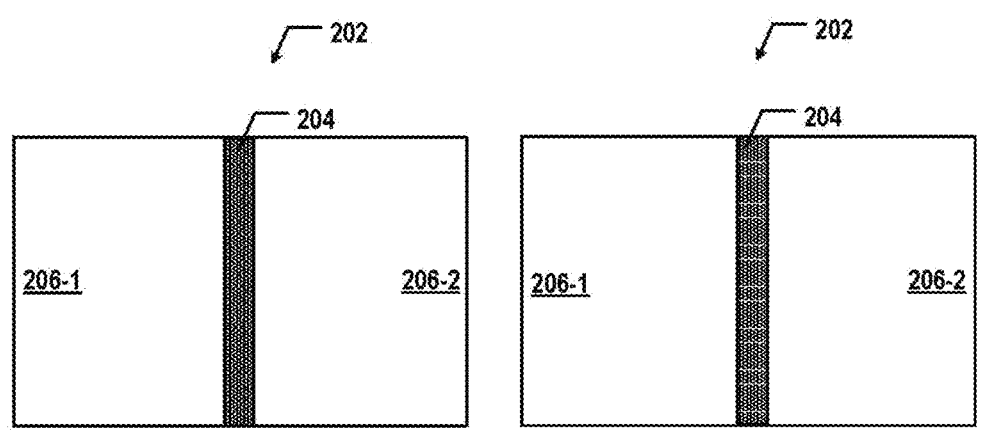
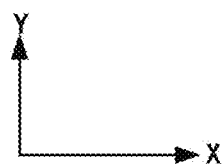
FIG. 2

D-D'

Forming a stack structure, including a plurality of first dielectric layers and a plurality of second dielectric layers that are alternately arranged, over a substrate, in a first lateral direction with respect to the substrate, the stack structure including a staircase region and two memory-array regions separated by the staircase region; in a second lateral direction with respect to the substrate, the stack structure being divided into multiple blocks with each block including multiple fingers and a wall-structure region; and adjacent blocks having the wall-structure regions configured between the fingers of one block and the fingers of another block, or having the fingers of both blocks configured between the wall-structure regions — S601

Forming an isolation structure through the stack structure on each side of the staircase region between adjacent blocks that have the multiple fingers in contact with each other; and forming a staircase structure from the stack structure in the staircase region of the multiple fingers of the two blocks, along the first lateral direction, the staircase structure including a plurality of sub-staircase structures, separating from each other by a first beam structure that extends along the second lateral direction and connects with the wall-structure regions of the two blocks; and within each block and along the second lateral direction, the sub-staircase structure including a plurality of rows of sub-stairs — S602

Forming a plurality of parallel gate line slits (GLSs) vertically through the stack structure and at the boundaries of each finger and each wall-structure region of the blocks, each GLS formed between adjacent blocks that have the multiple fingers in contact with each other being discontinued in the staircase region by two isolation structures formed on the two sides of the staircase region — S603

Removing the plurality of second dielectric layers from the memory-array regions and partially from the staircase region, after the removal, a center portion of the second dielectric layers located in the staircase region across adjacent blocks that have the multiple fingers in contact with each other is retained after the removal, and at least a portion of the second dielectric layers located in each first beam structure is also retained — S604

Forming a plurality of electrode layers in the empty spaces between adjacent first dielectric layers — S605

Forming a stack structure, including a plurality of first dielectric layers and a plurality of second dielectric layers that are alternately arranged, over a substrate, in a first lateral direction with respect to the substrate, the stack structure including a staircase region and two memory-array regions separated by the staircase region; in a second lateral direction with respect to the substrate, the stack structure being divided into multiple blocks with each block including multiple fingers and a wall-structure region; and adjacent blocks having the wall-structure regions configured between the fingers of one block and the fingers of another block, or having the fingers of both blocks configured between the wall-structure regions — S701

Forming an isolation structure through the stack structure on each side of the staircase region between adjacent blocks that have the multiple fingers in contact with each other; and forming a staircase structure from the stack structure in the staircase region of the multiple fingers of the two blocks, along the first lateral direction, the staircase structure including a plurality of sub-staircase structures, separating from each other by a first beam structure that extends along the second lateral direction and connects with the wall-structure regions of the two blocks; and within each block and along the second lateral direction, the sub-staircase structure including a single row of sub-stairs formed in the finger adjacent to the wall-structure region — S702

Forming a plurality of parallel gate line slits (GLSs) vertically through the stack structure and at the boundaries of each finger and each wall-structure region of the multiple blocks, each GLS formed between adjacent blocks that have the multiple fingers in contact with each other is discontinued in the staircase region by two isolation structures formed on the two sides of the staircase region, and within a block, each GLS formed between adjacent fingers is limited in a memory-array region without extending into the staircase region — S703

Removing the plurality of second dielectric layers from the memory-array regions and partially from the staircase region, after the removal, a center portion of the second dielectric layers located in the staircase region across adjacent blocks that have the multiple fingers in contact with each other retained, and at least a portion of the second dielectric layers located in each first beam structure also retained — S704

Forming a plurality of electrode layers in the empty spaces between adjacent first dielectric layers — S705

FIG. 39

MEMORY DEVICE AND FABRICATION METHOD THEREOF

CROSS-REFERENCE TO RELATED APPLICATION

This application is a continuation of International Application No. PCT/CN2020/120022, filed on Oct. 9, 2020, the entire content of which is incorporated herein by reference.

FIELD OF THE DISCLOSURE

The present disclosure generally relates to the field of semiconductor fabrication technology and, more particularly, relates to a memory device and fabrication method thereof.

BACKGROUND

The production process of semiconductor electronic has made great progress with the development of the planar flash memory. However, in recent years, the continuous development of the planar flash memory encountered a number of challenges, such as physical limits, existing lithography limits, storage electron density limits, etc. In this context, in order to solve the difficulties encountered by the planar flash memory and pursue lower production cost per storage unit, various three-dimensional (3D) flash memory structures, including 3D not-or (NOR) and 3D not-and (NAND), have emerged.

In the 3D flash memory of the NOR type structure, the storage units are arranged in parallel between the bit line and the ground line, while in the 3D flash memory of the NAND type structure, the storage units are arranged in series between the bit line and the ground line. An NAND flash memory with a tandem structure has a lower read speed, but has a higher write speed and erase speed. Therefore, the NAND flash memory is suitable for storing data. In addition, the NAND flash memory also demonstrates many advantages, such as small unit size and large storage capacity, for data storage.

A 3D NAND flash memory includes a plurality of memory array structures with each memory array structure including a plurality of memory cells that are arranged in a 3D array. The 3D NAND flash memory further includes a plurality of staircase structures for making electrical connections to the memory cells at different levels. In many designs, each staircase structure corresponds to one memory array structure and is located on one side of the memory array structure. The electrical connections from the staircase structure all extend to a same direction to connect the memory array structure. When the number of the stacking layers in the memory array structure increases, the resistance of the connection lines from the staircase structure to the memory array structure increases, causing a resistive-capacitive (RC) delay problem. Therefore, the performance of the 3D NAND flash memory may be undesired.

To reduce the length of the connection lines between a staircase structure and the corresponding memory cells, in some designs, the staircase structure is disposed between two memory array structures, and the electrical connections from the staircase structure can extend in both directions to connect the memory array structures. As such, the overall resistance of the connection lines may be low, and thus the RC delay problem may be suppressed. When the staircase structure is formed between two memory array structures, some electrical connections formed on the staircase structure need to go through a wall structure to electrically connect to the two memory structures. However, when the number of the stacking layers in the 3D NAND flash memory increases, the height of the wall structure may increase, and thus collapsing of the wall structure may become an issue for the 3D NAND flash memory.

The disclosed memory device and fabrication method are directed to solve one or more problems set forth above and other problems in the art.

BRIEF SUMMARY OF THE DISCLOSURE

One aspect of the present disclosure provides a memory device. The memory device includes a substrate; and a stack structure including a plurality of first dielectric layers and a plurality of electrode layers that are alternately arranged over the substrate. In a first lateral direction with respect to the substrate, the memory device includes array regions and an intermediate region arranged between the array regions. In a second lateral direction with respect to the substrate, the stack structure includes a first block and a second block, each including a wall-structure region. In the intermediate region, wall-structure regions of the first block and the second block are separated by a staircase structure. The memory device further includes a beam structure, located in the intermediate region and including at least a plurality of discrete first beam structures, each extending along the second lateral direction and connecting the wall-structure regions of the first block and the second block; and a plurality of second dielectric layers, located in the beam structure. In the plurality of discrete first beam structures, the plurality of second dielectric layers is alternated with the plurality of first dielectric layers.

Another aspect of the present disclosure provides a method for forming a memory device. The method includes forming a stack structure, including a plurality of first dielectric layers and a plurality of second dielectric layers that are alternately arranged over a substrate. In a first lateral direction with respect to the substrate, the stack structure is formed in array regions and an intermediate region arranged between the array regions. The method includes forming a staircase structure and a plurality of discrete first beam structures in the intermediate region. Each first beam structure of the plurality of discrete first beam structures extends along a second lateral direction with respect to the substrate. The method further includes forming a plurality of gate line slits (GLSs), vertically through the stack structure and into the substrate, and extending along the first lateral direction. In the second lateral direction, the plurality of GLSs at least defines a first block and a second block. The plurality of GLSs includes a GLS formed in each array region at the boundary between the first block and the second block. The method further includes removing the plurality of second dielectric layers from the array regions and partially from the intermediate region. After removing the plurality of second dielectric layers from the array regions and partially from the intermediate region, a portion of the plurality of second dielectric layers remains in the plurality of discrete first beam structures.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 1 illustrates a schematic diagram of a 3D memory device having staircase structures at edges of memory planes;

FIG. 2 illustrates a schematic diagram of another 3D memory device having staircase structures in intermediate regions of memory planes;

FIG. 24 illustrates a flowchart of an exemplary method for forming a memory device according to various embodiments of the present disclosure;

FIG. 39 illustrates a flowchart of an exemplary method for forming a memory device according to various embodiments of the present disclosure;

DETAILED DESCRIPTION

Figure 3:
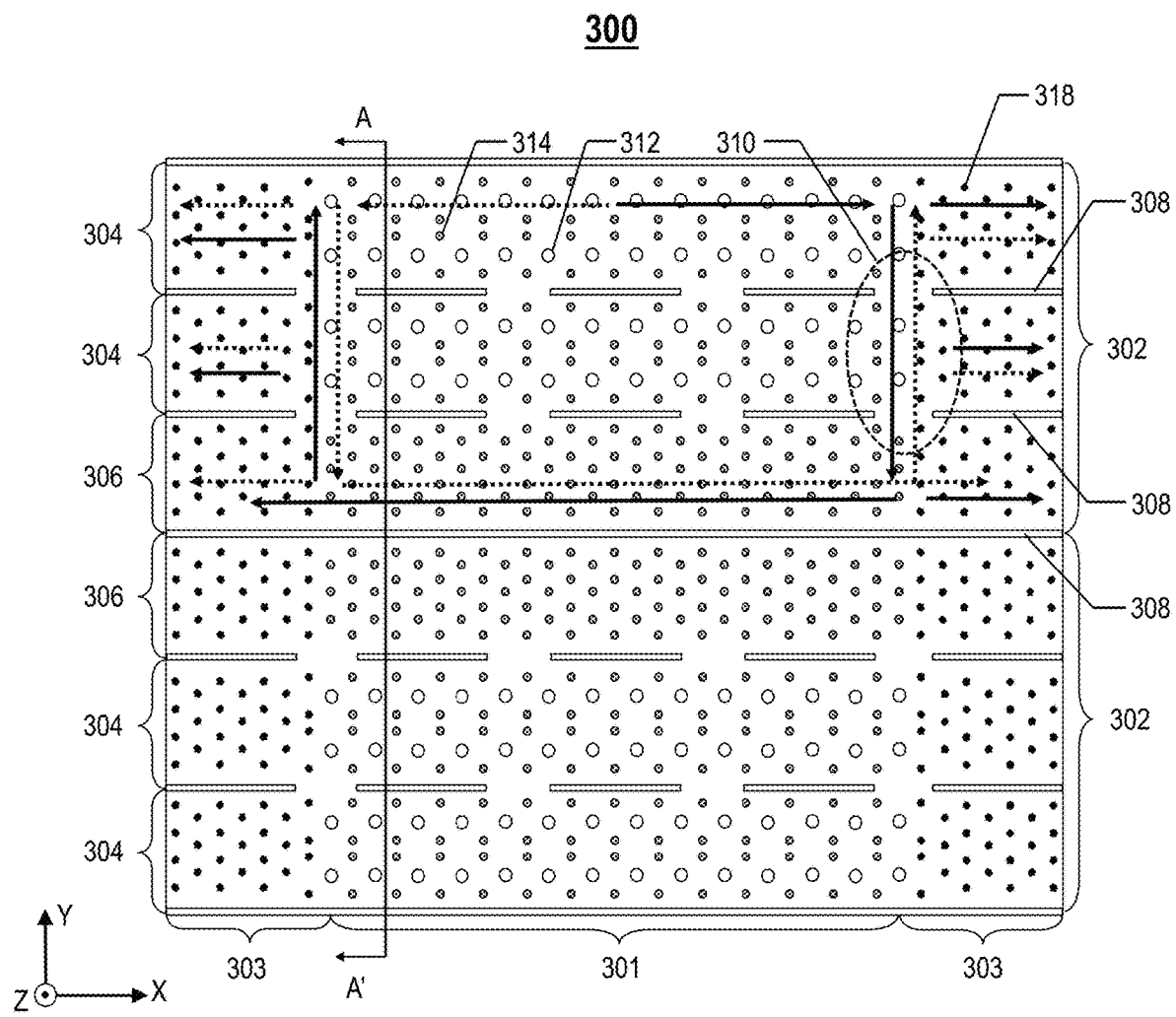
FIG. 3 illustrates a plan view of a 3D memory device having a staircase structure at a center of a memory plane.

Reference will now be made in detail to exemplary embodiments of the invention, which are illustrated in the accompanying drawings. Wherever possible, the same reference numbers will be used throughout the drawings to refer to the same or like parts.

Although specific configurations and arrangements are discussed, it should be understood that this is done for illustrative purposes only. A person skilled in the pertinent art should recognize that other configurations and arrangements can be used without departing from the spirit and scope of the present disclosure. It will be apparent to a person skilled in the pertinent art that the present disclosure can also be employed in a variety of other applications.

It should be noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings", such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides (edges) of the stacked storage structure for purposes such as word line fan-out. As staircase structures are usually formed at the edges of each memory plane, memory cells are unilaterally driven by row decoders (also known as "x-decoders") also arranged at the edges of each memory plane through the word lines and corresponding staircase structures.

FIG. 1 illustrates a schematic diagram of a 3D memory device having staircase structures at the edges of memory planes. Referring to FIG. 1, the 3D memory device 100, e.g. a 3D NAND memory device, includes two memory planes 102 each having a memory cell array in a memory array structure 106. It is noted that X and Y axes are included in FIG. 1 to illustrate two orthogonal (perpendicular) directions in the wafer plane. The X-direction is the word line direction of the 3D memory device 100, and the Y-direction is the bit line direction of the 3D memory device 100. The 3D memory device 100 also includes two staircase structures 104 at opposite sides in the X-direction of each memory array structure 106. Each word line of the memory plane 102 extends laterally in the X-direction across the entire memory plane 102 to a respective stair (level) in the staircase structure 104. A row decoder (not shown) is formed right above, below, or in proximity to a respective staircase structure 104 to reduce the interconnect length. That is, each row decoder unilaterally (either in the positive or negative X-direction, but not both) drives one-half of the memory cells through one-half of the word lines, each of which crosses the entire memory plane 102.

The load of the unilateral row word line-driving scheme thus includes the resistance of the entire word line across the memory plane 102. Moreover, as the demand for higher storage capacity continues to increase, the number of vertical levels of the stacked storage structure increases, and the thickness of the stack layers, including each word line film, decreases. Thus, high resistance may be introduced into the load, thereby causing a significant resistive-capacitive (RC) delay. Accordingly, the performance of the 3D memory device 100, such as the read and write speed, may be affected by the unilateral word line-driving scheme with side staircase structures 104.

To reduce the RC delay, in some other 3D memory devices, staircase structures are disposed between memory planes to enable a bilateral word line-driving scheme. By replacing the conventional side staircase structures with, for example, center staircase structures, each row decoder may bilaterally drive word lines in opposite directions from the middle of the memory plane, such that the resistance in the load may be reduced as the length of the word line to be driven by the row decoder decreases, for example, to one half. In some 3D memory devices, a wall structure is introduced as part of the staircase structures to connect the word line separated by the center/intermediate staircase structure. In addition, a multi-division staircase structure, in which each stair of the staircase structure includes multiple divisions for fan-out multiple word lines, is used to increase the utilization of the staircase structure and reduce the fabrication complexity. Moreover, multiple chopping processes are used to form multiple staircases at different depths to reduce the number of trim-etch processes, thereby further reducing the fabrication complexity and increasing the yield. Further, the divisions are formed after the formation of the staircases to reduce the number of material layer pairs (e.g., silicon nitride and silicon oxide pairs) in the stack structure to be etched, thereby reducing the thickness requirement for the hard mask covering areas outside of the staircases zones (e.g., the wall structures).

FIG. 2 illustrates a schematic diagram of another 3D memory device having staircase structures in the intermediate regions of memory planes. Referring to FIG. 2, a 3D memory device 200 includes two memory planes 202. Each memory plane 102 includes a memory array structure 206-1/206-2 and an intermediate region. A staircase structure 204 formed in the intermediate region laterally divides the memory array structure 206-1/206-2 into a first memory array structure 206-1 and a second memory array structure 206-2 in the X-direction (the word line direction). That is, the staircase structure 204 is formed between the first memory array structure 206-1 and the second memory array structure 206-2. Different from the 3D memory device 100 shown in FIG. 1 in which the staircase structures 104 are at opposite sides of each memory array structure 106, each staircase structure 204 in the 3D memory device 200 is located between the first memory array structure 206-1 and the second memory array structure 206-2. As shown in FIG. 2, in some examples, for each memory plane 202, the staircase structure 204 is in the middle of memory array structure 206-1/206-2. That is, the staircase structure 204 may be a center staircase structure that equally divides the memory array structure 206-1/206-2 into the first memory array structure 206-1 and the second memory array structure 206-2 with the same number of memory cells. For example, the first memory array structure 206-1 and the second memory array structure 206-2 may be symmetric in the X-direction with respect to the center staircase structure 204. It should be understood that in some other examples, the staircase structure 204 may be not in the middle (i.e. at the exact center) of the memory array structure 206-1/206-2, such that the first memory array structure 206-1 and the second memory array structure 206-2 may have different sizes and/or numbers of memory cells. In some examples, the 3D memory device 200 is a NAND Flash memory device in which memory cells are provided in the form of an array of NAND memory strings (not shown) in the first memory array structure 206-1 and the second memory array structure 206-2. The first memory array structure 206-1 and the second memory array structure 206-2 may include any other suitable components including, but not limited to, gate line slits (GLSs), through array contacts (TACs), array common sources (ACSs), etc.

Each word line (not shown) of a memory plane 202 extending laterally in the X-direction is separated by the corresponding staircase structure 204 into two parts: a first word line part across the first memory array structure 206-1, and a second word line part across the second memory array structure 206-2. As described below in detail, the two parts of each word line are electrically connected by a wall structure (not shown) in the staircase structure 204 at a respective stair in staircase structure 204. A row decoder (not shown) is formed right above, below, or in proximity to the respective staircase structure 204 to reduce the interconnect length. As a result, different from the row decoder of the 3D memory device 100 shown in FIG. 1, each row decoder of the 3D memory device 200 bilaterally (both in the positive and negative X-directions) drives the memory cells in the first memory array structure 206-1 and the second memory array structure 206-2. That is, by replacing the conventional side staircase structures (e.g., the staircase structures 104 shown in FIG. 1) with, for example, the staircase structures 204 in the intermediate of the memory array structure 206-1/206-2, each row decoder bilaterally drives the word lines in opposite directions from the intermediate of the memory plane 202, such that the resistance in the load may be reduced as the length of the part of each word line to be driven by the row decoder decreases, for example, to one half when the staircase structure 204 is disposed in the middle of the memory array structure 206-1/206-2. That is, the row decoder of the 3D memory device 200 only needs to drive either the first word line part or the second word line part of each word line.

Figure 4:
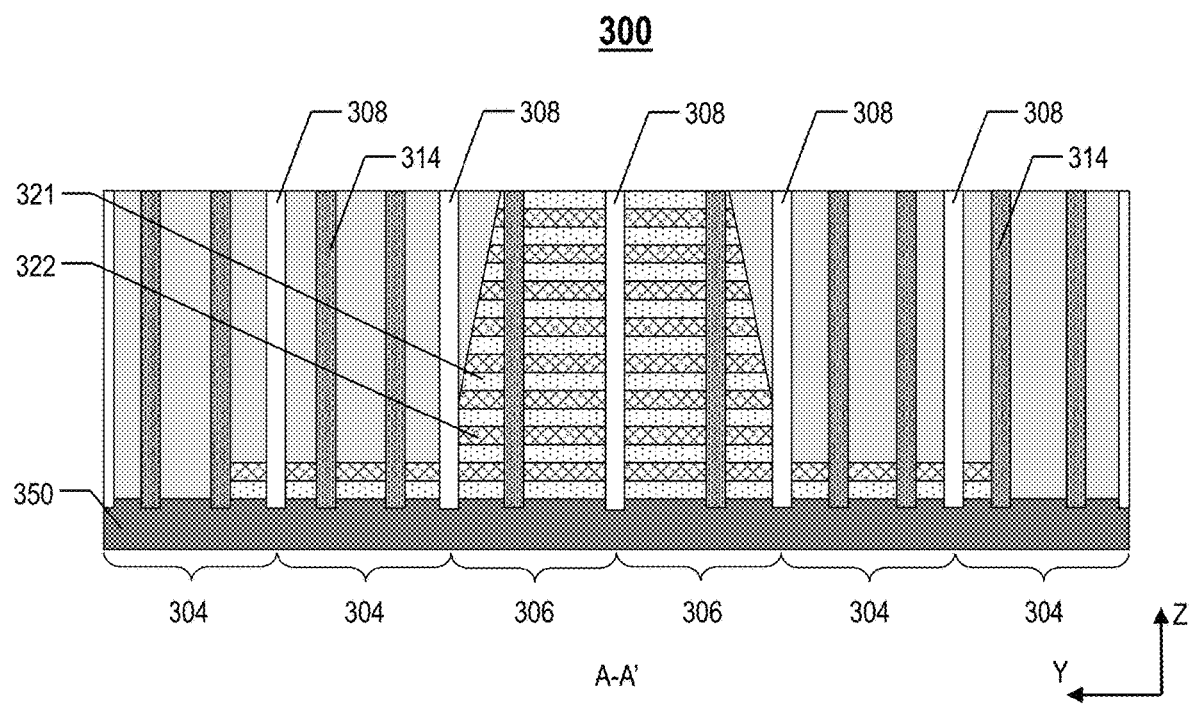
FIG. 4 illustrates a cross-sectional view of the 3D memory device shown in FIG. 3 along an A-A' line.

FIG. 3 illustrates a plan view of a 3D memory device having a staircase structure at a center of a memory plane, and FIG. 4 illustrates a cross-sectional view of the 3D memory device shown in FIG. 3 along an A-A' line. Referring to FIGS. 3-4, X, Y, and Z axes are used to illustrate the spatial relationship of the components in the 3D memory device 300. The 3D memory device 300 includes a substrate 350 and a stack structure, including a plurality of dielectric layers 321 and a plurality of sacrificial layers 322. The plurality of dielectric layers 321 and the plurality of sacrificial layers 322 are alternately arranged. In the X-direction, the 3D memory device 300 includes an intermediate region 301 at the center of a memory plane (not shown). The 3D memory device 200 may be one example of the memory plane 202 shown in FIG. 2 that includes a staircase structure 204 formed in the intermediate region of the memory plane 202, and the intermediate region 301 of the 3D memory device 300 may be an example corresponding to the intermediate region in the memory plane 202. As shown in FIG. 3, the 3D memory device 300 is divided into multiple blocks 302 in the Y-direction (the bit line direction) separated by a plurality of parallel GLSs 308. In some examples, the 3D memory device 300 is a NAND Flash memory device, and accordingly, each block 302 is the smallest erasable unit of the NAND Flash memory device. Each block 302 further includes multiple fingers 304 in the Y-direction separated by some of the GLSs 308 with "H" cuts 310. Each block 302 also includes a wall-structure region 306 separating the block 302 from an adjacent block 302.

Referring to FIG. 3, the 3D memory device 300 also includes two array regions 303 separated by the intermediate region 301. A plurality of top select gates (TSGs) may be formed in the array regions 303, and the plurality of TSGs may be electrically connected to interconnects over the intermediate region 301. As described below in detail, the intermediate region 301 includes multiple staircase zones each corresponding to a respective finger 304 and also includes multiple wall structures (not labeled) corresponding to the wall-structure regions 306. That is, each wall structure is formed in a region overlapped by the intermediate regions 301 and a corresponding wall-structure region 306. Therefore, the wall structure does not extend into any array region 303 along the X-direction. The 3D memory device 300 includes a plurality of dummy channel structures 314 in the intermediate region 301 including the staircase zones and the wall structures to provide mechanical support and/or load balancing. The 3D memory device 300 further includes a plurality of word line contacts 312 in the staircase zones of the intermediate region 301 and each word line contact 312 is landed on a respective word line (not shown) at each stair in the intermediate region 301 for word line driving. The 3D memory device 300 may also include a plurality of channel structures 318 formed in the two array regions 303.

To achieve the bilateral word line-driving scheme, each wall structure connects (both physically and electrically) a first memory array structure and a second memory array structure (not shown) that are respectively formed in the two array regions 303. In the memory device, each word line is bilaterally driven (in both positive and negative x-directions) from a respective word line contact 312 in the staircase zones of the intermediate region 301 in the intermediate of the 3D memory device 300 through the wall structures. FIG. 3 further schematically illustrates the current paths of the bilateral word line-driving scheme with the wall structures. A first current path indicated by the solid-line arrows and a second current path indicated by the dashed-line arrows represent currents passing through two separate word lines at different levels, respectively.

Figure 5:
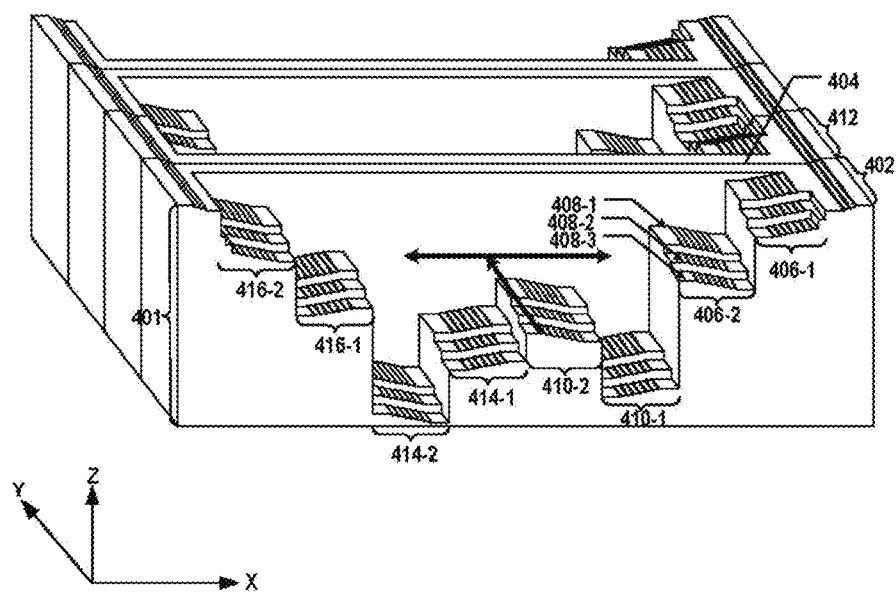
FIG. 5 illustrates a top front perspective view of a staircase structure of a 3D memory device.

FIG. 5 illustrates a top front perspective view of an intermediate region 400 of a 3D memory device. The intermediate region 400 may be one example of the intermediate region of the 3D memory device 200 shown in FIG. 2 or may correspond to the intermediate region 301 of the 3D memory device 300 shown in FIG. 3. The intermediate region 400 includes a stack structure 401 formed on a substrate (not shown).

In FIG. 5, X, Y, and Z axes are used to illustrate the spatial relationship of the components in the intermediate region 400. The substrate of the 3D memory device includes two lateral surfaces extending laterally in the X-Y plane: a top surface on the front side of the wafer on which the staircase structure is formed, and a bottom surface on the backside opposite to the front side of the wafer. The Z-axis is perpendicular to both the X and Y axes. As used herein, whether one component (e.g., a layer or a device) is "on," "above," or "below" another component (e.g., a layer or a device) of the 3D memory device is determined relative to the substrate of the 3D memory device in the Z-direction (the vertical direction perpendicular to the X-Y plane) when the substrate is positioned in the lowest plane of the 3D memory device in the Z-direction.

The stack structure 401 includes a plurality of first material layers (not shown) and a plurality of second material layers (not shown) that are alternatively stacked in the Z-direction. The material used for forming the plurality of first material layers is different from the material used for forming the plurality of second material layers. That is, the stack structure 401 includes a plurality of material layer pairs stacked vertically in the Z-direction with each material layer pair includes a first material layer and a second material layer. The number of the material layer pairs in the stack structure 401 (e.g., 32, 64, 96, 128, 160, 192, 224, or 256) determines the number of memory cells stacked in the Z-direction.

For example, the 3D memory device is a NAND Flash memory device, and the stack structure 401 is a stacked storage structure through which NAND memory strings are formed. Each of the first material layers includes a conductive layer, and each of the second material layers includes a dielectric layer. That is, the stack structure 401 includes interleaved conductive layers and dielectric layers (not shown). Further, each conductive layer functions as a gate line of the NAND memory strings and a word line extending laterally from the gate line and ending at a staircase structure formed in the intermediate region 400 for word line fan-out.

Each stair (as shown as a "level") of the staircase structure formed in the intermediate region 400 includes one or more material layer pairs. Referring to FIG. 5, the top material layer of each stair is a conductive layer for interconnection in the vertical direction (Z-direction), and every two adjacent stairs of the staircase structure are offset by a nominally same distance in the Z-direction and a nominally same distance in the X-direction. Each offset thus forms a "landing area" for interconnection with the corresponding word line contact (not shown) of the 3D memory device in the Z-direction direction.

As shown in FIG. 5, the intermediate region 400 includes a first staircase zone 402, a second staircase zone 412, and a wall structure 404 between the first staircase zone 402 and the second staircase zone 412 in the Y-direction (the bit line direction). Each of the first staircase zone 402 and the second staircase zone 412 includes a staircase structure. The staircase structure of the first staircase zone 402 includes a plurality pairs of staircases including a first pair of staircases 406-1 and 406-2, a second pair of staircases 410-1 and 410-2, a third pair of staircases 414-1 and 414-2, and a fourth pair of staircases 416-1 and 416-2 in the X-direction (the word line direction). Each staircase (e.g., 406-1, 406-2, 410-1, 410-2, 414-1, 414-2, 416-1, or 416-2) includes a plurality of stairs in the X-direction. Moreover, each staircase is a functional staircase used for landing interconnects (e.g., word line via contacts), as opposed to a dummy staircase.

Further, the first staircase zone 402 includes three fingers in the Y-direction, and accordingly, each staircase of 406-1, 406-2, 410-1, 410-2, 414-1, 414-2, 416-1, and 416-2 includes three divisions 408-1, 408-2, and 408-3 in the Y-direction. In the staircase 406-2, each stair in the division 408-2 is below any stair in the division 408-1 and is above any stair in the division 408-3.

Further, at least one stair in the staircase of the first staircase zone 402 or the second staircase zone 412 is electrically connected to each of the first memory array structure and the second memory array structure through the wall structure 404. For example, as shown in FIG. 5, a stair in the staircase 410-2 may be electrically connected to both the first memory array structure and the second memory array structure through the wall structure 404 by the respective word line parts extending in the negative and positive X-directions, respectively, as indicated by the current paths (represented by the arrows).

Referring to FIG. 5, as the number of the material layer pairs in the stack structure 401 increases, the staircase exposing the bottom material layer pair has a large depth with respect to the top of the wall structure 404. That is, the aspect ratio of the wall structure (the height in the Z-direction versus the width in the Y-direction) is large. In addition, the increase in the number of the material layer pairs in the stuck structure 401 also leads to an increase in the length of the wall structure 404 along the X-direction. Further, referring to FIGS. 3-4, in the process of fabricating the 3D memory device, a plurality of GLSs may be fabricated after forming the staircases. For example, referring to FIG. 3, a GLS needs to be formed all the way through the entire wall structure in the X-direction to separate adjacent staircase zones. With a large aspect ratio and a large length of the wall structure, the wall structure may easily collapse when forming the GLS through the entire length of the wall structure. As such, the performance of the 3D memory device may be undesired.

The present disclosure provides a method for forming a memory device. According to the disclosed method, the formed staircase structure includes a plurality of sub-staircase structures, and along the length direction of the wall structure, adjacent sub-staircase structures are separated from each other by a first beam structure that connects with the wall structure. The first beam structure may provide mechanical support for the wall structure, thereby preventing the wall structure from collapsing when forming a GLS through the wall structure. Moreover, for adjacent blocks that have the fingers configured between their wall-structure regions, GLSs formed between the two blocks are discontinued in the intermediate region by two first isolation structures formed respectively on the two sides of the intermediate region. In the intermediate region across the two blocks, a second beam structure connects the first isolation structure formed on each side of the intermediate region. In the second beam structure, after removing the second dielectric layers from the array regions, a portion of the second dielectric layers is retained between adjacent first dielectric layers. As such, the second dielectric layers together with the first dielectric layers located in the second beam structure not only provide mechanical support for subsequent fabrication processes and but also provide electrical isolation for the two blocks. In addition, after removing the second dielectric layers from the array regions, at least a portion of the second dielectric layers remains in each first beam structure, which also provides mechanical support for subsequent fabrication processes.

FIG. 24 illustrates a flowchart of an exemplary method for forming a memory device according to various embodiments of the present disclosure. FIGS. 6-23 illustrate schematic views of semiconductor structures at certain stages of the exemplary method.

Figure 6:
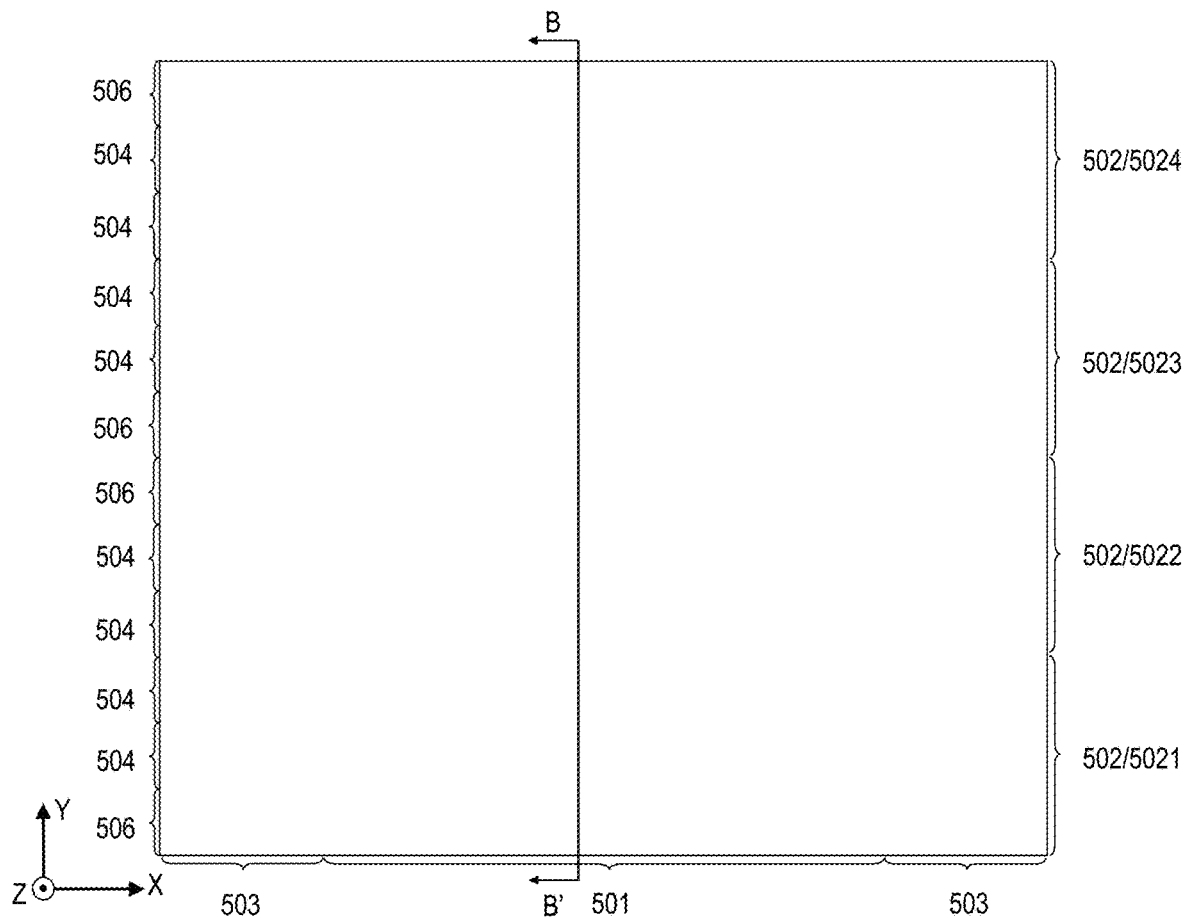
FIGS. 6-23 illustrate schematic views of semiconductor structures at certain stages of an exemplary method according to various embodiments of the present disclosure.
Figure 7:
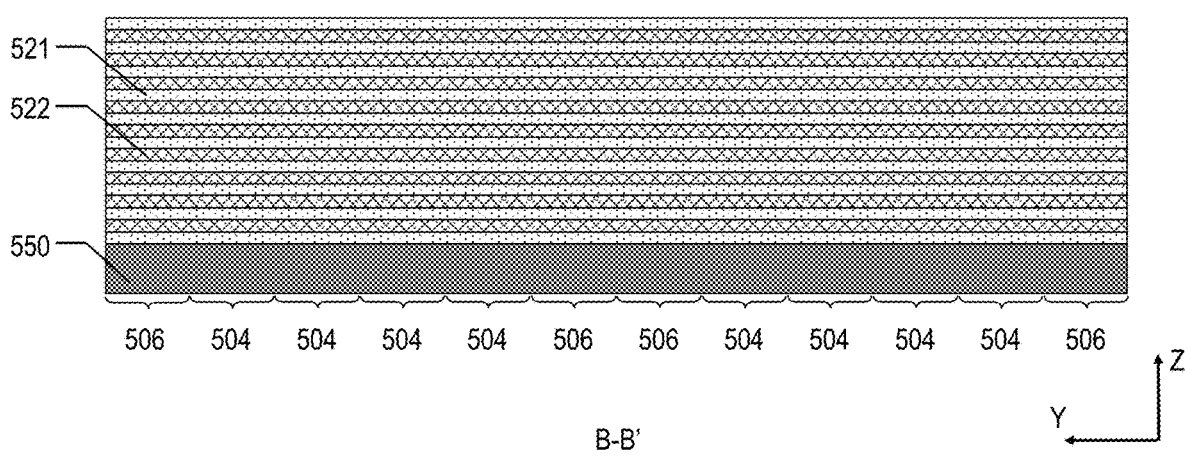

Referring to FIG. 24, a stack structure, including a plurality of first dielectric layers and a plurality of second dielectric layers that are alternately arranged over a substrate, may be formed; in a first lateral direction with respect to the substrate, the stack structure may include two array regions and an intermediate region arranged between the array regions; in a second lateral direction with respect to the substrate, the stack structure may be divided into a plurality of blocks with each block including a wall-structure region and multiple fingers arranged on one side of the wall-structure region; and adjacent blocks may have the wall-structure regions configured between the fingers of one block and the fingers of the other block, or have the fingers of both blocks configured between the wall-structure regions (S601). FIGS. 6-7 illustrate schematic views of an exemplary semiconductor structure according to various embodiments of the present disclosure. Specifically, FIG. 6 illustrates a schematic plane view of the semiconductor structure, and FIG. 7 illustrates a schematic cross-sectional view of the semiconductor structure shown in FIG. 6 along a B-B' line.

Referring to FIGS. 6-7, a stack structure, including a plurality of first dielectric layers 521 and a plurality of second dielectric layers 522, may be formed on a substrate 550. The to plurality of second dielectric layers 522 and the plurality of first dielectric layers 521 may be alternately disposed on the substrate 550. In FIGS. 6-7, X, Y, and Z axes are used to illustrate the spatial relationship of the components in the semiconductor structure. The same notion for describing the spatial relationship is applied throughout the present disclosure. In the first lateral direction (e.g., the X-direction), the stack structure may include and two array regions 503 and an intermediate region 501 arranged between the two array regions 503. In the second lateral direction (the Y-direction), the stack structure may be divided into multiple blocks 502. In one embodiment, each block 502 may be used to form an erasable unit of the 3D NAND Flash memory. Further, in the Y-direction, each block 502 may include multiple fingers 504 together with a wall-structure region 506.

Further, among the plurality of blocks 502, adjacent blocks 502 may have the wall-structure regions 506 of the two blocks 502 next to each other such that a wall structure may be formed in the intermediate region 501 across the boundary between the two blocks 502, or have the fingers 504 of the two blocks 502 configured between the wall-structure regions 506. For example, along the Y-direction, the plurality of blocks 502 may include a block 5021, a block 5022, a block 5023, and a block 5024 that are consecutively arranged along the Y-direction. The block 5021 and the block 5022 may be connected to each other with the multiple fingers 504 of the block 5021 adjacent to the multiple fingers 504 of the block 5022, the block 5022 and the block 5023 may be connected to each other with the wall-structure region 506 of the block 5022 adjacent to the wall-structure region 506 of the block 5023, and the block 5023 and the block 5024 may be connected to each other with the multiple fingers 504 of the block 5023 adjacent to the multiple fingers 504 of the block 5024. It should be noted that four blocks 502 (the block 5021, the block 5022, the block 5023, and the block 5024) are shown in FIG. 6 for illustration, and in actual applications, the semiconductor structure may at least include two blocks that have the fingers of both blocks configured between the wall-structure regions. It should also be noted that only a part of each array region 503 that is adjacent to the intermediate region 501 is shown in FIG. 6.

In subsequent fabrication processes, a plurality of memory cells (e.g. a memory array structure) may be formed in each array region 503. Moreover, a staircase structure may be formed in the intermediate region 501 across adjacent blocks 502 that have the fingers 504 of both blocks 502 configured between the wall-structure regions 506. Accordingly, a wall structure may be simultaneously formed in the intermediate region 501 across adjacent blocks 502 that have the wall-structure regions 506 next to each other.

In one embodiment, the substrate 550 may be made of silicon, germanium, silicon germanium, or any other appropriate semiconductor material. In other embodiments, the substrate may be made of silicon on insulator (SOI), germanium on insulator (GOI), or any other appropriate semiconductor composite.

In one embodiment, the plurality of first dielectric layers 521 may be made of an oxide, e.g. silicon oxide, and the plurality of second dielectric layers 522 may be made of a nitride, e.g. silicon nitride. Therefore, the stack structure may be a nitride-oxide (NO) stack structure including a plurality of NO stacks.

Figure 8:
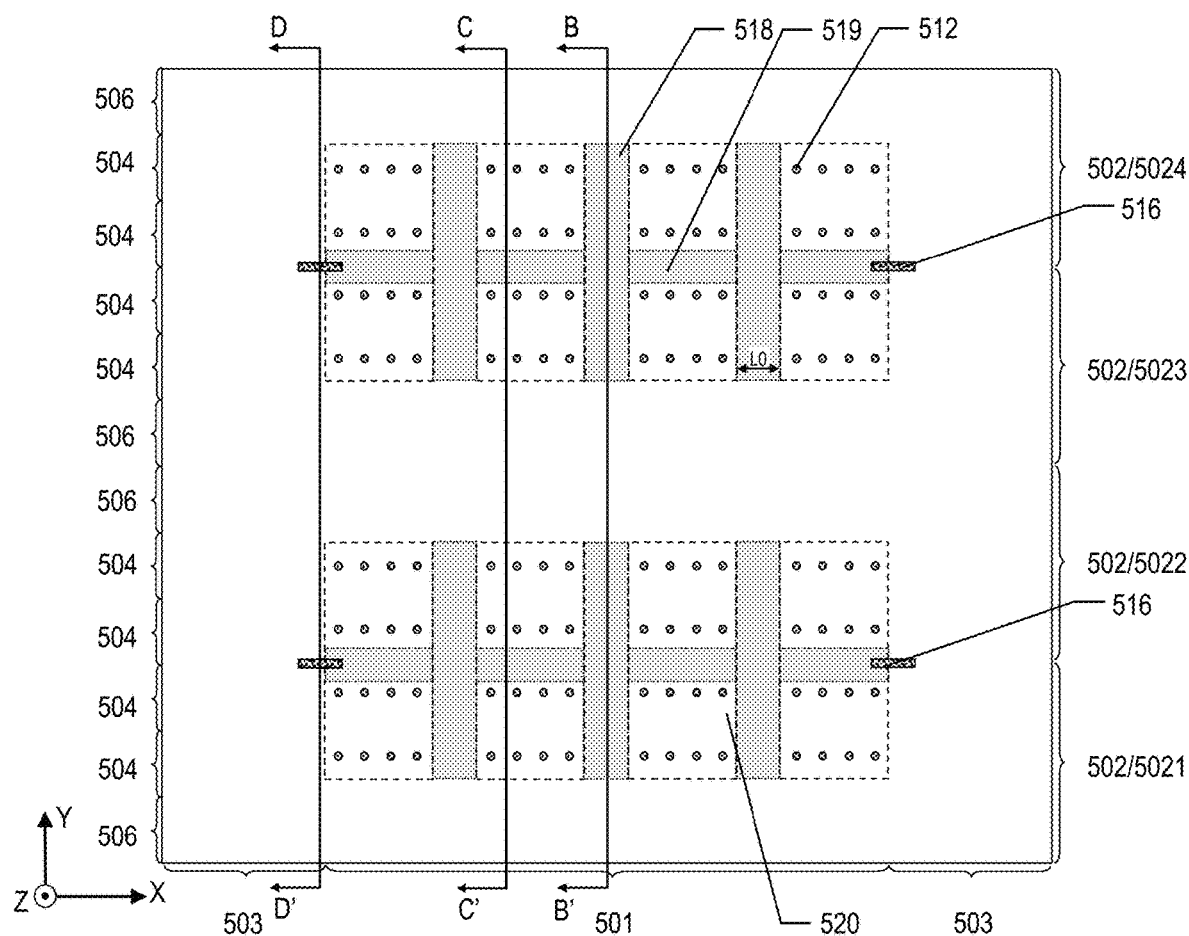
Figure 9:
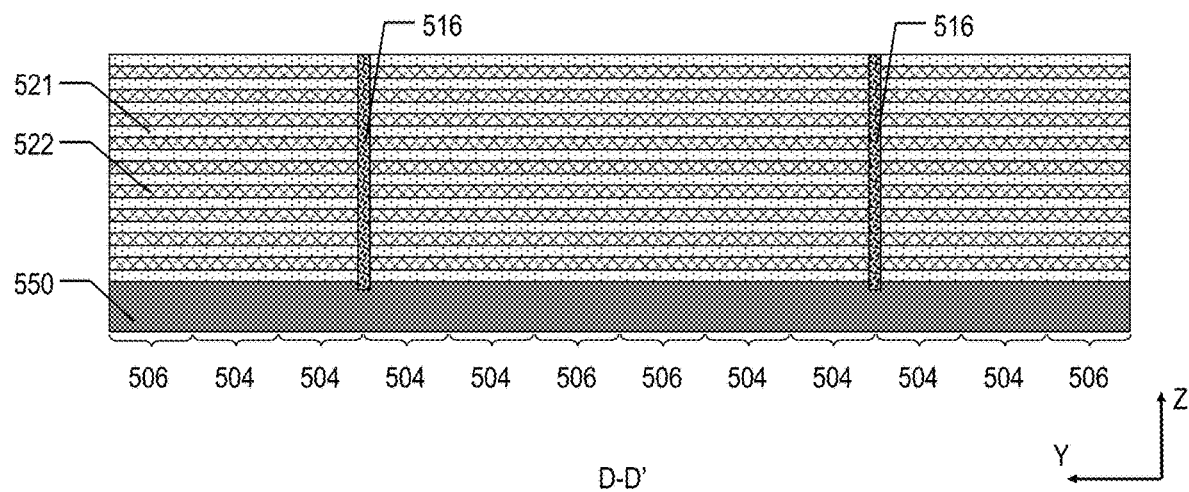
Figure 10:
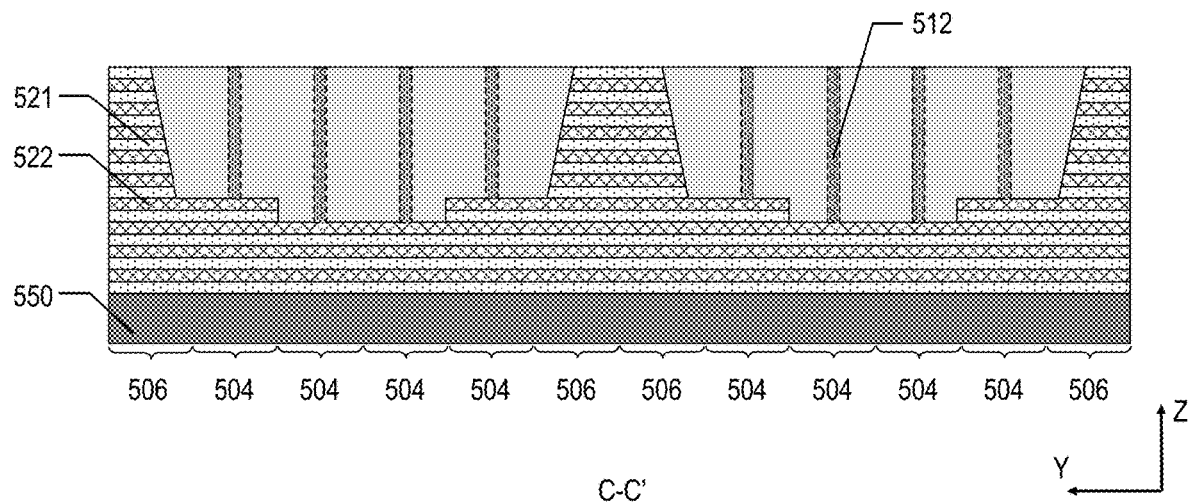
Figure 11:
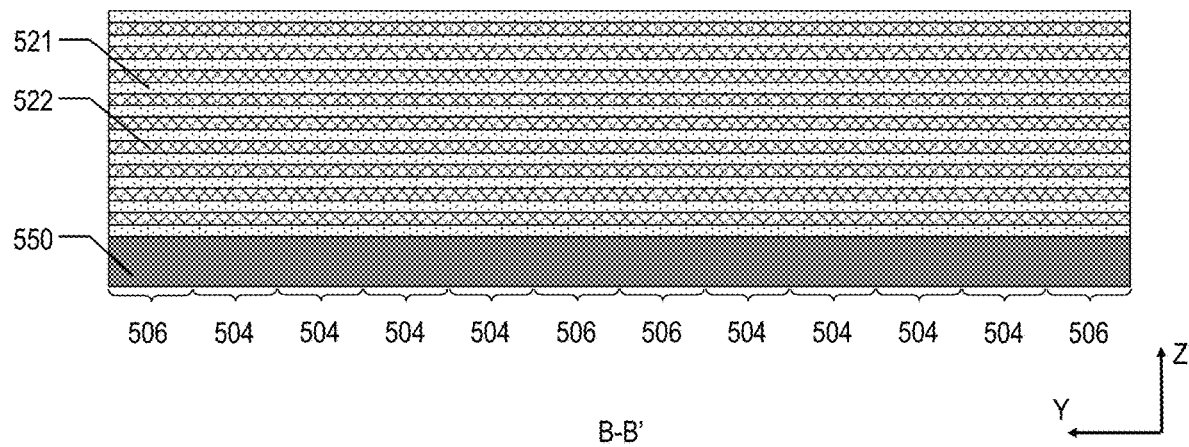

Further, returning to FIG. 24, a first isolation structure may be formed through the stack structure on each side of the intermediate region between two blocks that have the fingers of both blocks configured between the wall-structure regions; a staircase structure may be formed from the stack structure in the intermediate region of the multiple fingers of the two blocks; along the first lateral direction, the staircase structure may include a plurality of sub-staircase structures, separating from each other by a first beam structure that extends along the second lateral direction and connects with the wall-structure regions of the two blocks; within each block and along the second lateral direction, the sub-staircase structure may include a plurality of rows of sub-stairs formed in the plurality of fingers (S602). FIGS. 8-11 illustrate schematic views of an exemplary semiconductor structure according to various embodiments of the present disclosure. Specifically, FIG. 8 illustrates a schematic plane view of the semiconductor structure, FIG. 9 illustrates a schematic cross-sectional view of the semiconductor structure shown in FIG. 8 along a D-D' line, FIG. 10 illustrates a schematic cross-sectional view of the semiconductor structure shown in FIG. 8 along a C-C' line, and FIG. 11 illustrates a schematic cross-sectional view of the semiconductor structure shown in FIG. 8 along a B-B' line.

Referring to FIGS. 8-11, between two blocks 502 that have the multiple fingers 504 in contact with each other (e.g., between the block 5021 and the block 5022, and between the block 5023 and the block 5024, respectively), a first isolation structure 516 may be formed through the stack structure on each side of the intermediate region 501. Moreover, a staircase structure (not labeled) may be formed from the stack structure in the intermediate region 501 of the multiple fingers 504 of the two blocks 502; along the X-direction, the staircase structure may include a plurality of sub-staircase structures 520, and adjacent sub-staircase structures 520 may be separated from each other by a first beam structure 518 extending along the Y-direction. The first beam structure 518 may be connected to the wall-structure region 506 of each block 520. In one embodiment, in the X-direction, the width of each first beam structure 518 may be L0.

In one embodiment, within each block 502, the sub-staircase structure 520 may include a plurality of rows of sub-stairs (not shown) extending along the Y-direction. In a subsequent process, word line contacts 512 may be formed on the sub-stairs formed in the staircase structure. For example, the word line contacts 512 may be formed in each finger 504 to electrically connect the sub-stairs formed in the finger 504. It should be noted that the word line contacts 512 may be formed in a subsequent process, and the circles in FIG. 8 and the dashed plugs in FIG. 10 are merely used to schematically indicate the intended positions for forming the word line contacts 512 in the subsequent process. It should also be noted that the portion of second dielectric layer 522 vertically under each intended word line contact 512 may be replaced with an electrode layer in a subsequent process in order to establish an electrical connection to the corresponding word line contact 512.

Referring to FIGS. 8-9, along the D-D' line in the array region 503 close to the intermediate region 501, the first isolation structure 516 formed between blocks 502 having the multiple fingers 504 in contact with each other may penetrate through the stack structure. Referring to FIGS. 8 and 10, along the C-C' line parallel to the Y-direction and cutting through a sub-staircase structure 520, a word line contact 512 may be formed in each finger 504 in a subsequent process to electrically connect a corresponding stair. In addition, after forming the staircase structure including the plurality of sub-staircase structures 520, a wall structure (not labeled) extending along the X-direction may be simultaneously formed in the intermediate region 501 between adjacent blocks 502 that have the wall-structure regions 506 in contact with each other. Therefore, the width of the wall structure (referring to FIG. 10) in the Y-direction is approximately the total width of the two adjacent wall-structure regions 506. Referring to FIGS. 8 and 11, along the B-B' line parallel to the Y-direction and cutting through a first beam structure 518 between adjacent sub-staircase structures 520, the stack structure may remain unchanged after forming the first isolation structure 516 and the staircase structure. Therefore, the first beam structures 518 extending along the Y-direction may prevent the wall structure from having a narrow width (approximately the total width of two wall-structure regions 506) all the way from one side of the intermediate region 501 to the other side of the intermediate region 501. As such, the wall structure may not easily collapse when fabricating a GLS through the wall structure along the X-direction.

For each pair of blocks 502 that have the multiple fingers 504 in contact with each other, the first isolation structure 516 formed on each side of the intermediate region 501 may be used to provide protection for the center portion of the second dielectric layers 522 in the staircase structure between the two blocks 502, such that the center portion of the second dielectric layers 522 in the staircase structure between the two blocks 502 may not be removed when replacing the second dielectric layer 522 with metallic electrode layers in a subsequent process. The remaining center portion of the second dielectric layers 522 (which may be made of a nitride) together with the first dielectric layers 521 (which may be made of an oxide) in the staircase structure between the two blocks 502 may not only provide mechanical support for the subsequent fabrication processes, but also provide electric isolation for the two blocks 502 in the formed memory device.

In one embodiment, the first isolation structure 516 may have a rectangular shape. The dimension of the first isolation structure 516 in the X-direction may be larger than a dimension of the first isolation structure 516 in the Y-direction. For example, the dimension of the first isolation structure 516 in the Y-direction may be in a range of approximately 10 nm to 40 nm. The dimension of the first isolation structure 516 in the Y-direction may not be too large, otherwise the process for filling up the corresponding opening to form the first isolation structure 516 may take more time and use more materials. The dimension of the first isolation structure 516 in the Y-direction may not be too small, otherwise the first isolation structure 516 may not be able to provide sufficient protection for the center portion of the second dielectric layers 522 in the staircase structure between the two blocks 502 during a subsequent etching process. Moreover, the dimension of the first isolation structure 516 in the X-direction may be larger than the half of the dimension of the finger 504 in the Y-direction. In addition, the dimension of each finger 504 in the Y-direction may be approximately the same as the dimension of the wall-structure region 506 in the Y-direction. In other embodiments, the first isolation structure may have any other appropriate shape.

In one embodiment, the portion of the first isolation structure 516 formed in the array region 503 may be substantially larger than the portion of the first isolation structure 516 formed in the intermediate region 501. For example, the entire first isolation structure 516 may be formed in the array region 503 with an edge overlapped with the boundary between the array region 503 and the intermediate region 501, or the portion of the first isolation structure 516 formed in the array region 503 may be two times larger than the portion of the first isolation structure 516 formed in the intermediate region 501. In other embodiments, the portion of the first isolation structure formed in the array region may be equal to or smaller than the portion of the first isolation structure formed in the wall-structure region.

The first isolation structure 516 may be made of an insulating material, e.g. silicon oxide. It should be noted that when removing the second dielectric layers 522 in a subsequent etching process, the etch rate of the material used to form the first isolation structure 516 may be substantially smaller than the etch rate of the material used to form the second dielectric layers 522.

Referring to FIG. 8, in the staircase structure formed across adjacent blocks 502 that have the multiple fingers in contact with each other, a region close to the boundary between the two blocks 502 is referred to as a second beam structure 519. In a subsequent process, after partially replacing the second dielectric layers 522 in the staircase structure with electrode layers, a portion of the second dielectric layers 522 (referring to FIG. 10) may remain in the second beam structure 519 to provide mechanical support for the material layers and electrical isolation for the two blocks 502. It should be noted that in FIG. 8, a rectangular region connecting the first isolation structure 516 formed at each side of the intermediate region 501 is used to schematically represent the position of the second beam structure 519, and in actual applications, after the plurality of second dielectric layers 522 are partially removed from the intermediate region, the remaining portion of the second dielectric layers in each sub-staircase structure 520 may have a shape different from the rectangular shape shown in FIG. 8. In addition, as shown in FIG. 10, because sub-stairs are formed in each sub-staircase structure 520, the top layer of first dielectric layer 521 located at the boundary between the block 5021 and the block 5022 or between the block 5023 and the block 5024 may be lower than the top surface of the initially formed stack structure. Therefore, the top surface of the second beam structure 519 may be lower than the top surface of the first beam structure 518. In the schematic top view shown in FIG. 8, because the first beam structure 518 and the second beam structure 519 have different height, the second beam structure 519 is displayed as discrete portions cut by the plurality of first beam structures 518.

Figure 12:
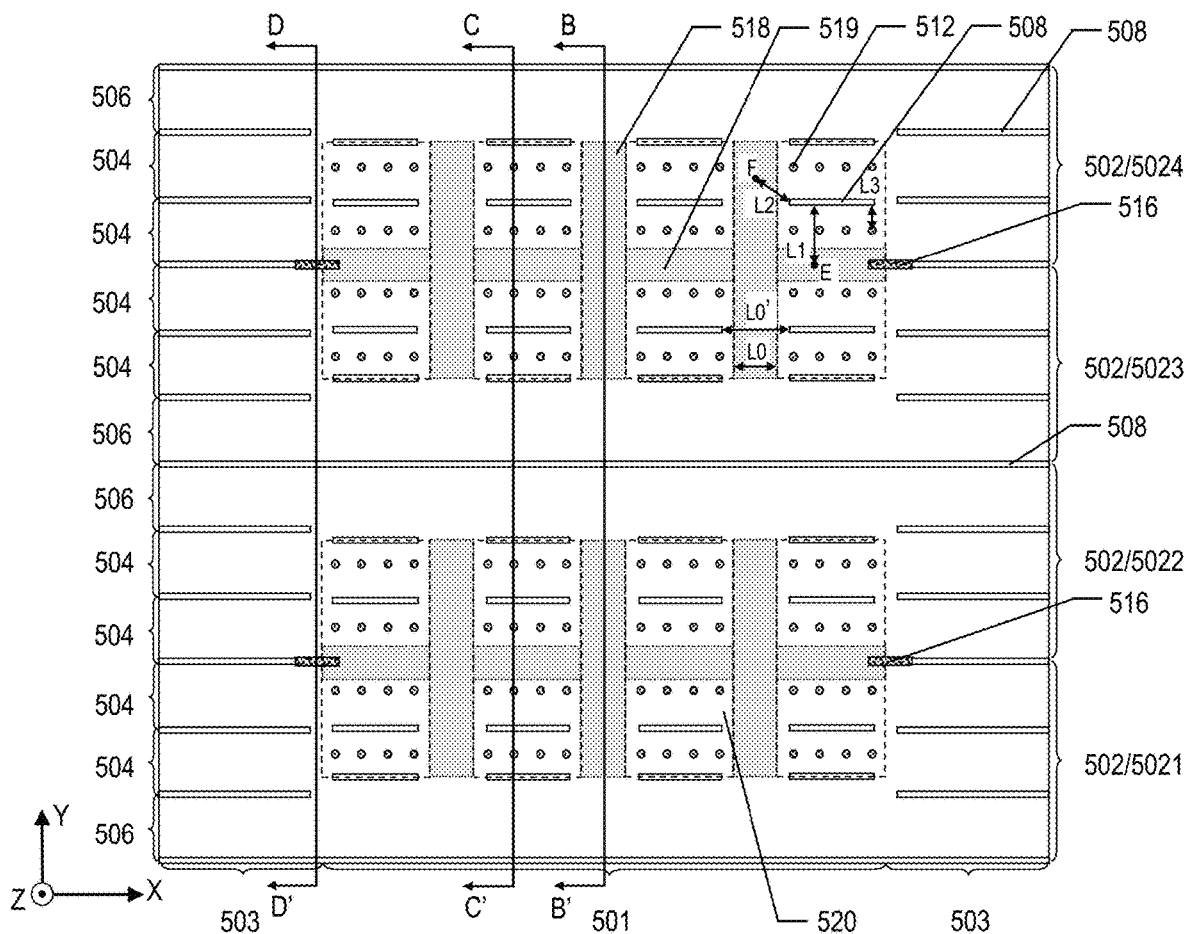
Figure 13:
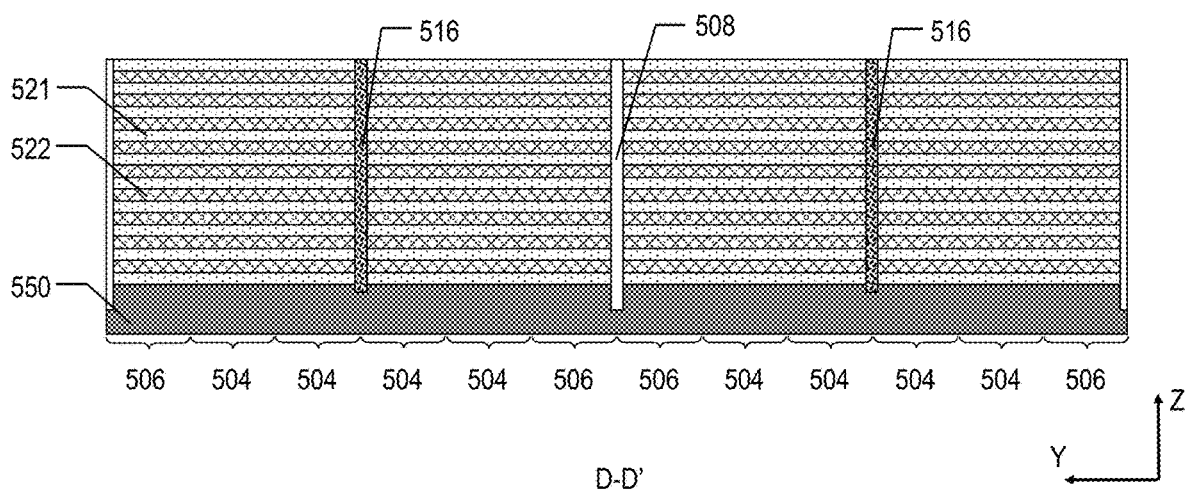
Figure 14:
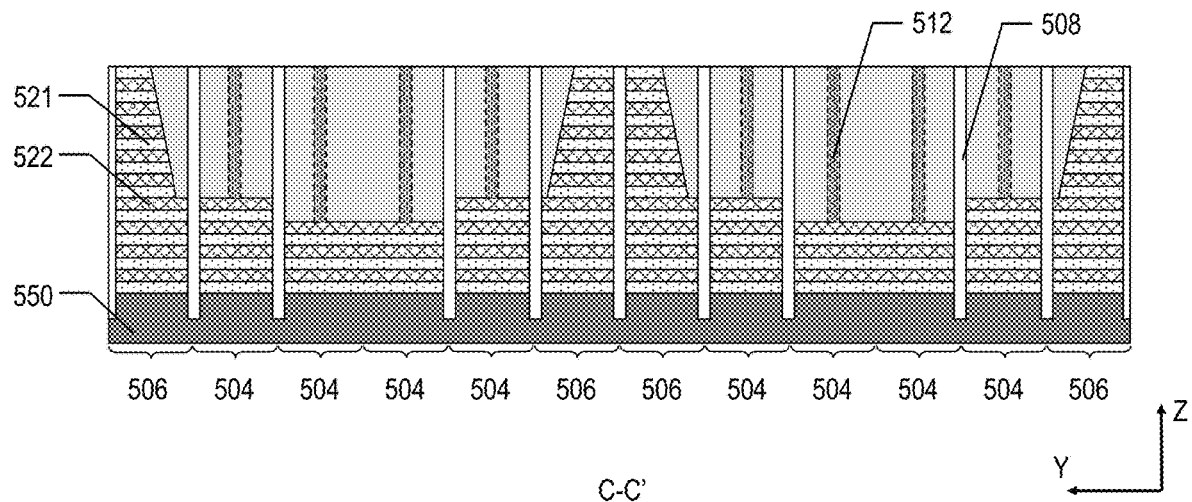
Figure 15:
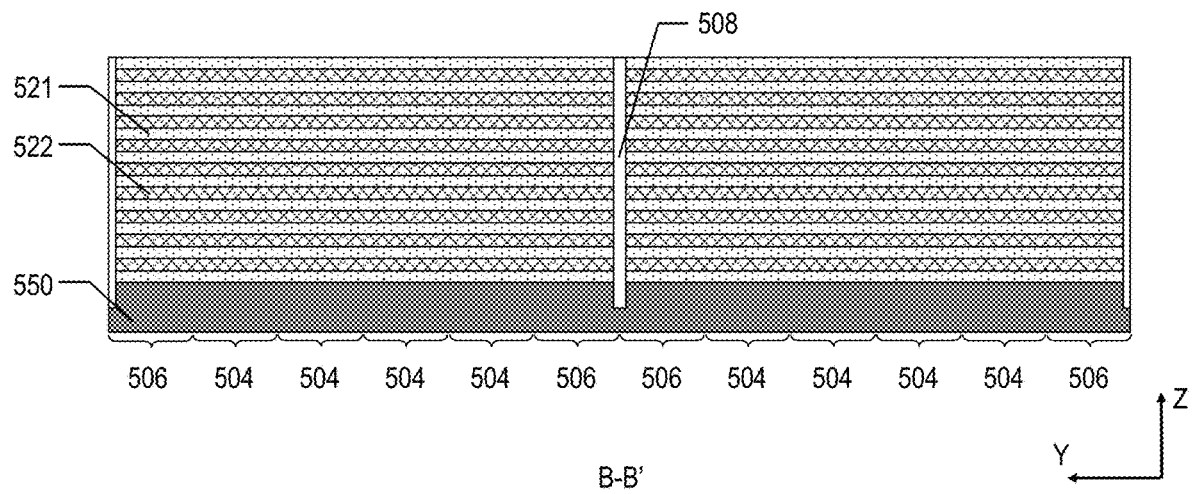

Further, returning to FIG. 24, a plurality of gate line slits (GLSs) extending along the first lateral direction may be formed vertically through the stack structure and at the boundaries of each finger and each wall-structure region of the blocks, each GLS formed between adjacent blocks that have the multiple fingers in contact with each other may be discontinued in the intermediate region by two first isolation structures formed on the two sides of the intermediate region (S603). FIGS. 12-15 illustrate schematic views of an exemplary semiconductor structure according to various embodiments of the present disclosure. Specifically, FIG. 12 illustrates a schematic plane view of the semiconductor structure, FIG. 13 illustrates a schematic cross-sectional view of the semiconductor structure shown in FIG. 12 along a D-D' line, FIG. 14 illustrates a schematic cross-sectional view of the semiconductor structure shown in FIG. 12 along a C-C' line, and FIG. 15 illustrates a schematic cross-sectional view of the semiconductor structure shown in FIG. 12 along a B-B' line.

Referring to FIGS. 12-15, a plurality of GLSs 508 extending along the X-direction may be formed vertically through the stack structure and at the boundaries of each finger 504 and each wall-structure region 506 of the plurality of blocks 502. The GLS 508 formed between adjacent blocks 502 that have the wall-structure regions 506 in contact with each other (also referred to as a second separation structure) may extend through the array regions 503 and the intermediate region 501, and thus may electrically separate the two adjacent blocks 502. For example, referring to FIG. 12, the GLS 508 formed between the second block 5022 and the third block 5023 may extend through the entire stack structure along the X-direction.

The GLS 508 formed between adjacent blocks 502 that have the multiple fingers 504 in contact with each other (also referred as to a first separation structure) may be limited in the two array regions 503. That is, on each side of the intermediate region 501, the GLS 508 formed between two blocks 502 that have the multiple fingers 504 in contact with each other may be connected to a corresponding first isolation structure 516, and thus the GLS 508 (e.g. the first separation structure) may not extend into the intermediate region 501. For example, referring to FIG. 12, between the first block 5021 and the second block 5022 or between the third block 5023 and the fourth block 5024, each GLS 508 may only be formed in an array region 503 on one side of the intermediate region 501 and may be connected to (or terminated by) a first isolation structure 516 formed on the same side of the intermediate region 501.

Moreover, within each block 502 (including the first block 5021, the second block 5022, the third block 5023, and the fourth block 5024), GLSs 508 may also be formed between adjacent fingers 504 and between the wall-structure region 506 and the adjacent finger 504. For example, each GLS 508 formed between the wall-structure region 506 and the adjacent finger 504 may also be referred to as a third separation structure, and each GLS 508 formed between adjacent fingers 504 may also be referred to as a fourth separation structure. It should be noted that within each block 502, the GLSs 508 formed in the intermediate region 501 may not be exactly located at the boundaries between adjacent fingers 504 or between the wall-structure region 506 and the adjacent finger 504; in addition, the formed GLSs 508 may not extend into the first beam structures 518 in the X-direction. For example, a GLS 508 may be formed on the edge of a sub-staircase structure 520, and the length of the GLS 508 may be smaller than the width of the sub-staircase structure 520 in the X-direction. Similarly, a GLS 508 may be formed in a sub-staircase structure 520 between adjacent fingers 504, and the length of the GLS 508 may be smaller than the width of the sub-staircase structure 520 in the X-direction. It should also be noted that within each block 502, the GLS 508 formed in an array region 503 may extend through the entire array region 503 along the X-direction.

Referring to FIGS. 12-13, along the D-D' line in the array region 503 close to the intermediate region 501, a GLS 508 may be formed through the stack structure at the boundary between adjacent blocks 502 that have the wall-structure regions 506 in contact with each other. Referring to FIGS. 12 and 14, along the C-C' line parallel to the Y-direction and cutting through a sub-staircase structure 520, in addition to the GLS 508 formed at the boundary between two blocks 502 having the wall-structure regions 506 in contact with each other, GLSs 508 may also be formed within each block 502 to separate the multiple fingers 504 and the wall-structure region 506. It should be noted that in the intermediate region 501, GLS 508 may not be formed at the boundary between adjacent blocks 502 that have the multiple fingers 504 in contact with each other. Referring to FIGS. 12 and 15, along the B-B' line parallel to the Y-direction and cutting through a first beam structure 518 between adjacent sub-staircase structures 520, a GLS 508 may be formed through the stack structure at the boundary between adjacent blocks 502 that have the wall-structure regions 506 in contact with each other.

The plurality of GLSs 508 may serve as a process basis for replacing the plurality of second dielectric layers 522 in the array regions 503 and the staircase structures during a subsequent process. In one embodiment, at the boundary between adjacent blocks 502 that have the multiple fingers 504 in contact with each other, the GLS 508 may be formed only in the two array regions 503 (referring to FIG. 12 and FIG. 14). Moreover, when removing the plurality of second dielectric layers 522 from the array regions 503 in a subsequent process, the first isolation structures 516 formed on the two sides of the intermediate region 501 may provide protection for the center portion of the second dielectric layers 522 in the intermediate region 501 adjacent to the boundary between the two blocks 502. Therefore, after removing the second dielectric layers 522 from the array regions 503, a center portion of the second dielectric layers 522 (located in the second beam structure 519) may remain in the intermediate region 501 between the two blocks 502 that have the multiple fingers in contact with each other. Thus, the remaining center portion of the second dielectric layers 522 in the intermediate region 501 between the two blocks 502 may provide necessary mechanical support and electrical isolation for the subsequently formed memory device. In addition, the etching process may also be able to remove the portion of the second dielectric layers 522 vertically under the intended word line contacts 512.

For example, referring to FIG. 12, a distance from a point E that is located in the intermediate region 501 and at the boundary between two blocks 502 (e.g. the third block 5023 and the fourth block 5024) that have the multiple fingers 504 in contact with each other to a closest GLS 508 may be L1, and a distance from the position of a to-be-formed word line contact 512 to a closest GLS 508 may be L3. In order to ensure that a center portion of the second dielectric layers 522 in the intermediate region 501 between the two blocks 502 is retained after the portion of the second dielectric layers 522 vertically under the intended word line contacts 512 is removed, L1 may be always larger than L3. That is, the shortest distance from a point located in the intermediate region 501 and at the boundary between two blocks 502 that have the multiple fingers 504 in contact with each other to a closest GLS 508 may be larger than the longest distance from a position of a to-be-formed word line contact 512 to a closest GLS 508. Similarly, in order to ensure that a center portion of the second dielectric layers 522 in the intermediate region 501 between the two blocks 502 is retained after the portion of the second dielectric layers 522 in the array regions 503 is removed, the shortest distance from a point located in the intermediate region 501 and at the boundary between two blocks 502 that have the multiple fingers 504 in contact with each other to a closest GLS 508 may be larger than the longest distance from a point located in the array regions 503 to a closest GLS 508.

Further, after the portion of the second dielectric layers 522 vertically under the intended word line contacts 512 is removed, at least a portion of the second dielectric layers 522 in the first beam structure 518 may be retained. As such, the removing portion of the second dielectric layers 522 together with the plurality of first dielectric layers 521 may provide mechanical support for the material structures in the intermediate region 501. For example, referring to FIG. 12, a distance from a point F in a first beam structure 518 to a closest GLS 508 may be L2, and in order to ensure that at least a portion of the second dielectric layers 522 in the first beam structure 518 is retained after the portion of the second dielectric layers 522 vertically under the intended word line contacts 512 is removed, the largest value of L2 may be larger than the largest value of L3. That is, the longest distance from a point located in the first beam structure 518 to a closest GLS 508 may be longer than the longest distance from a position of a to-be-formed word line contact 512 to a closest GLS 508. As such, by properly selecting the etching time, after the portion of the second dielectric layers 522 vertically under the intended word line contacts 512 is removed, at least a portion of the second dielectric layers 522 in the first beam structure 518 is retained. Similarly, in order to ensure that at least a portion of the second dielectric layers 522 in the first beam structure 518 is retained after the portion of the second dielectric layers 522 in the array regions 503 is removed, the longest distance from a point located in the first beam structure 518 to a closest GLS 508 may be longer than the longest distance from a point located in the array regions 503 to a closest GLS 508.

Moreover, referring to FIG. 12, in the X-direction, the GLSs 508 formed in each sub-staircase structure 520 between adjacent fingers 504 or between a wall-structure region 506 and a finger 504 may be equal to or shorter than the dimension of the sub-staircase structure 520. Therefore, in the X-direction, the distance L0' between GLSs 508 may be equal to or larger than the distance L0 between sub-staircase structures 520. That is, the length of each GLS 508 formed in the sub-staircase structure 520 may be equal to or smaller than the width of the sub-staircase structure 520 in the X-direction. As such, when removing the second dielectric layers 522, the second dielectric layers 522 in the first beam structure 518 may have a less portion being removed, thereby conducive to retaining at least portion of the second dielectric layers 522 in the first beam structure 518 after the etching process.

Figure 16:
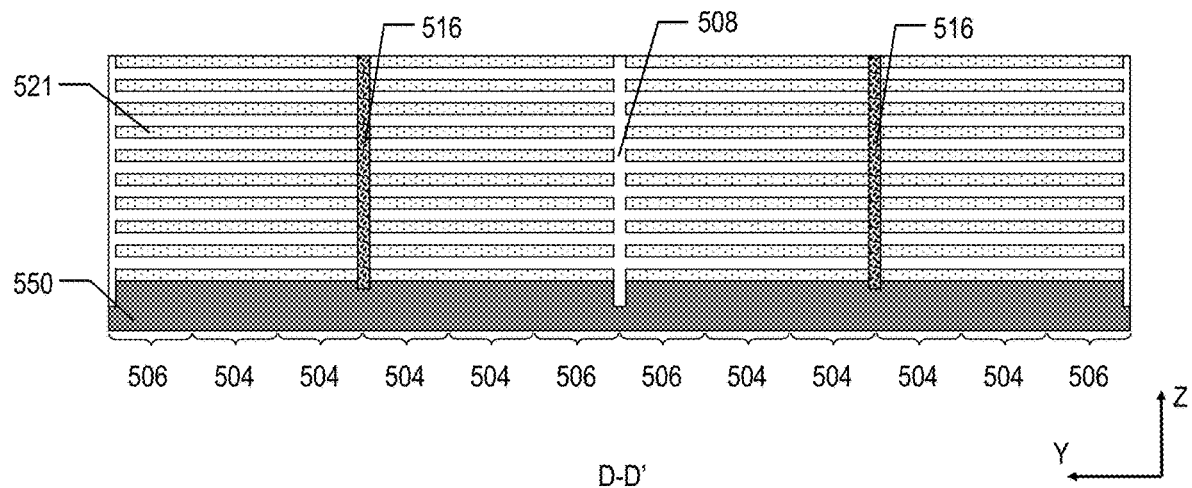
Figure 17:
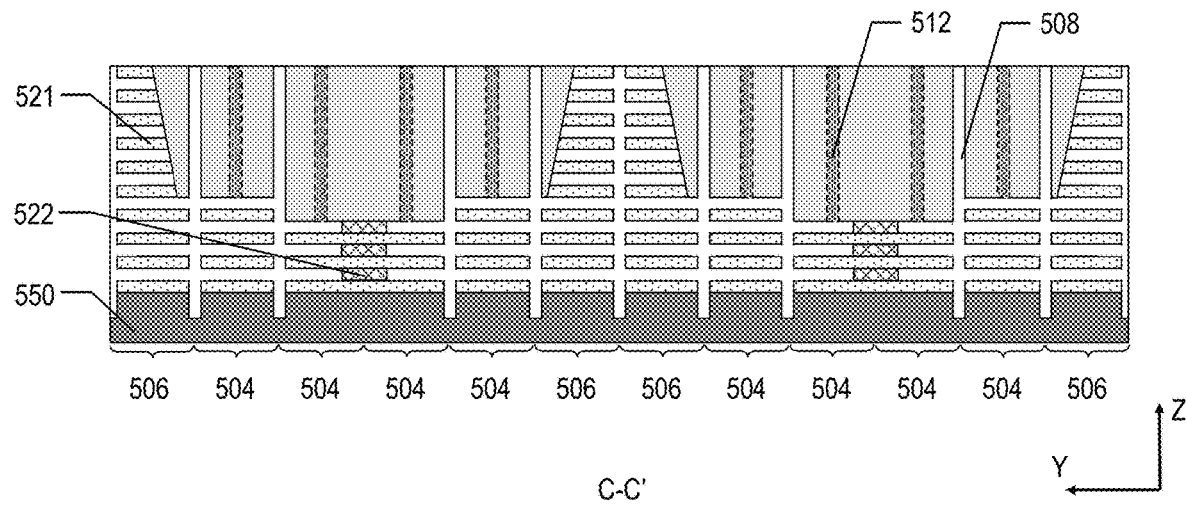
Figure 18:
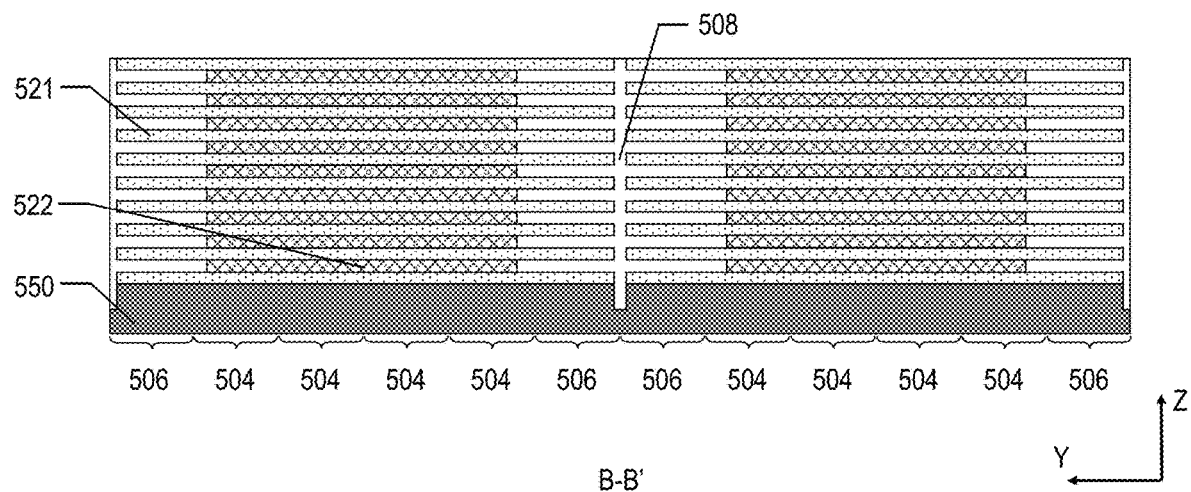
Figure 19:
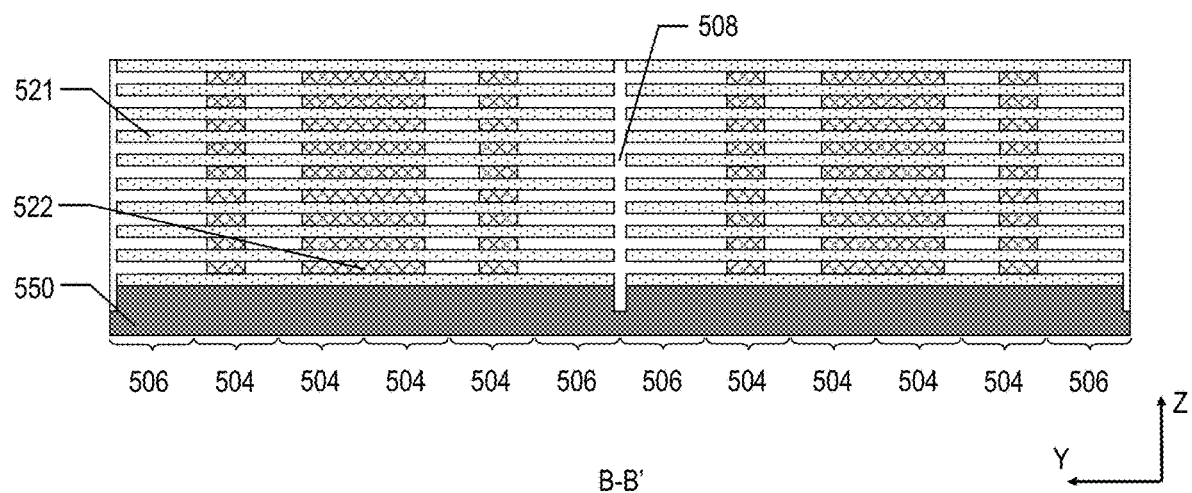

Further, returning to FIG. 24, the plurality of second dielectric layers may be removed from the array regions and partially from the intermediate region, and after removing the plurality of second dielectric layers from the array regions and partially from the intermediate region, a center portion of the second dielectric layers located in the intermediate region across adjacent blocks that have the multiple fingers in contact with each other may be retained, and at least a portion of the second dielectric layers located in each first beam structure may also be retained (S604). FIGS. 16-19 illustrate schematic cross-sectional views of a semiconductor structure consistent with various embodiments of the present disclosure. Specifically, the cross-sectional view shown in FIG. 16 is developed from the cross-sectional view shown in FIG. 13, the cross-sectional view shown in FIG. 17 is developed from the cross-sectional view shown in FIG. 14, and the cross-sectional views shown in FIGS. 18-19 are two examples developed from the cross-sectional view shown in FIG. 15. It should be noted that because the second dielectric layers are initially located between adjacent first dielectric layers, after removing the second dielectric layers from the array regions and partially from the intermediate region, the plane view of the semiconductor structure remains the same as the plane view shown in FIG. 12. That is, FIG. 12 also provides a schematic plane view of the semiconductor structure after removing the second dielectric layers from the array regions and the staircase structures.

Referring to FIGS. 12 and 16-19, the plurality of second dielectric layers 522 may be removed from the array regions 503 and partially from the intermediate region 501. Because FIG. 16 illustrates a schematic cross-sectional view of the semiconductor structure along the D-D' line, which is in an array region 503, the plurality second dielectric layers 522 at the cross-sectional view is completely removed. As shown in FIG. 17, a center portion of the plurality of second dielectric layers 522 across the boundary between two blocks 502 that have the multiple fingers 504 in contact with each other may remain in the semiconductor structure. As shown in FIG. 18, in one embodiment, a portion of the plurality of second dielectric layers 522 may be retained in the first beam structure 518, and each second dielectric layer 522 may continuously extend across two blocks 502 that have the multiple fingers 504 in contact with each other. As shown in FIG. 19, in other embodiments, the remaining portion of each second dielectric layer 522 may include a plurality of discrete sub-portions, and the plurality of second dielectric layers 522, together with the plurality of first dielectric layers 521, may form multiple vertical pillars, which may further provide mechanical support for subsequent fabrication processes. It should be noted that whether the remaining portion of each second dielectric layer 522 is a continuous film layer or discrete islands between two first dielectric layers 521 depends on the designed pattern of the GLSs 508, the present disclosure only requires that at least a portion of the second dielectric layer 522 is retained in each first beam structure 518 to provide sufficient mechanical support for the semiconductor structure.

Figure 20:
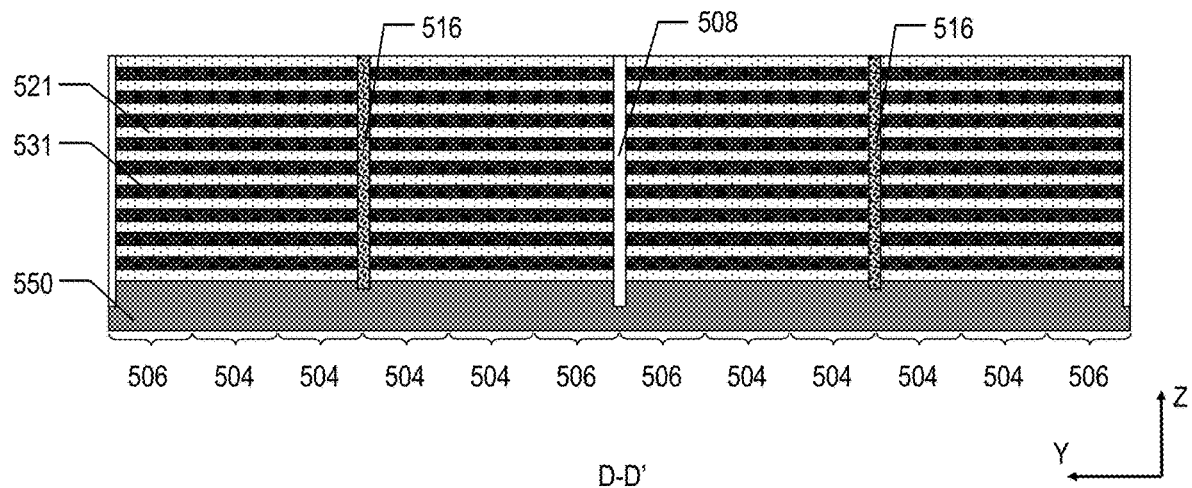
Figure 21:
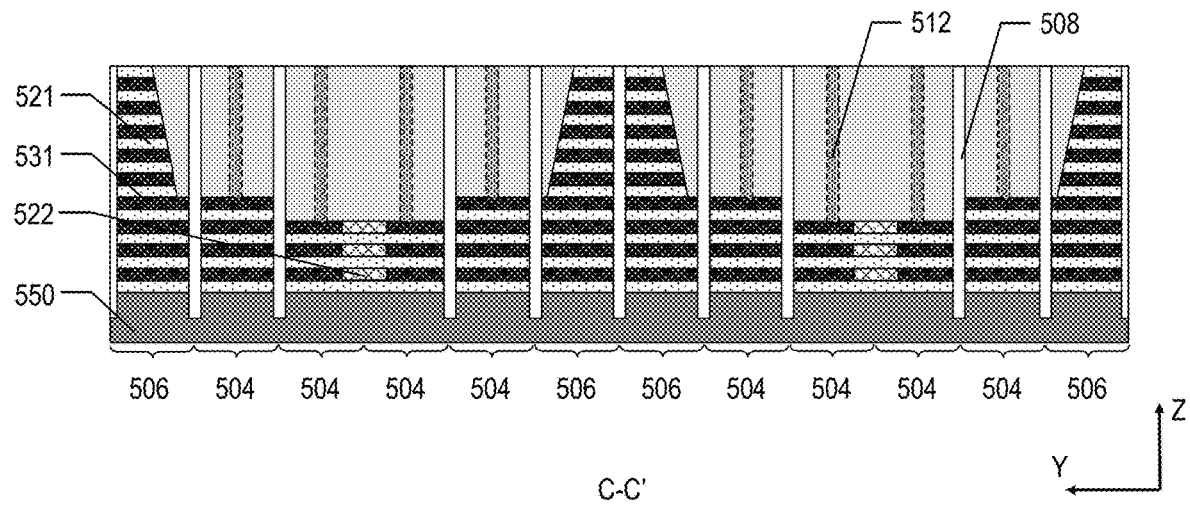
Figure 22:
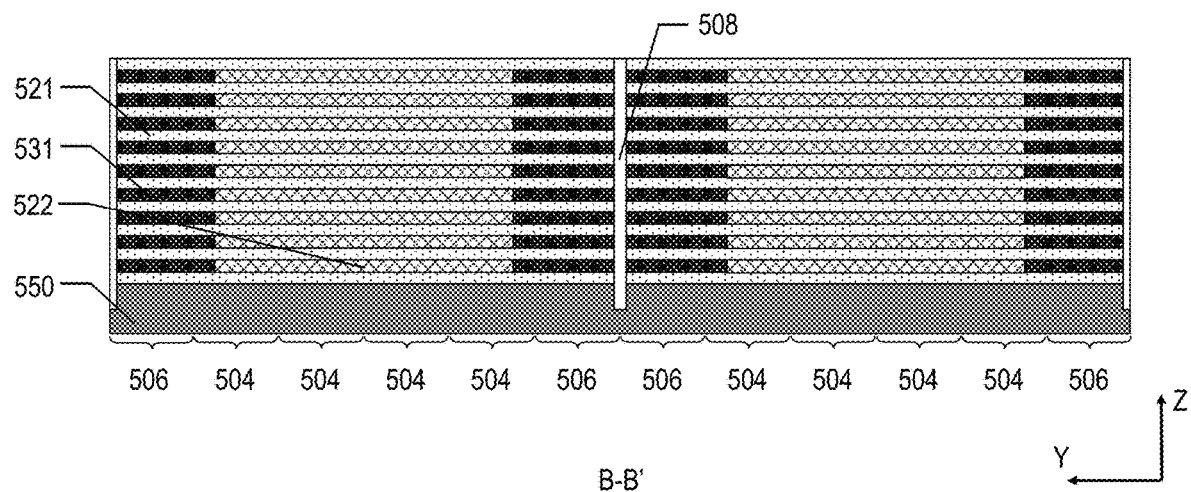
Figure 23:
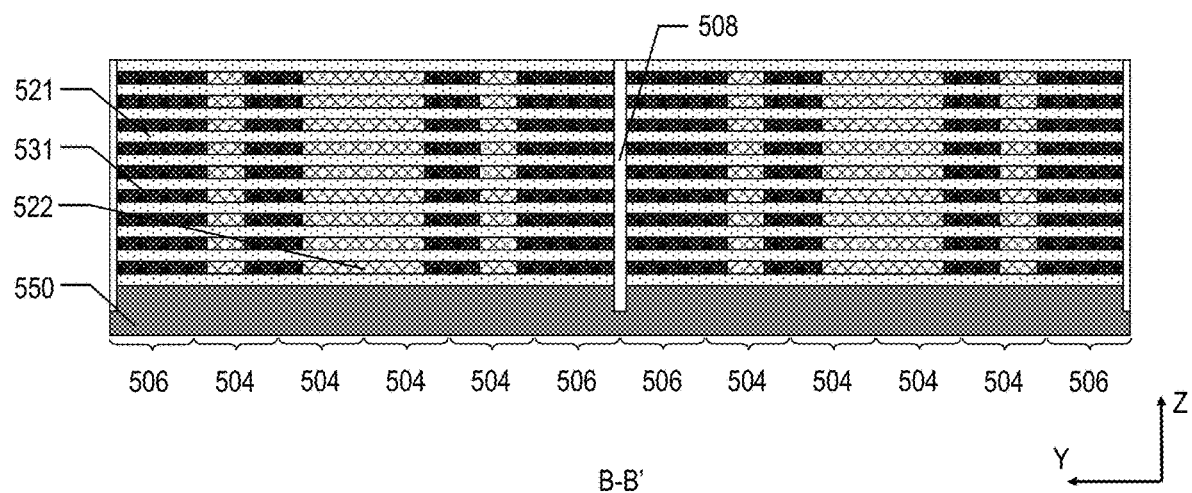

Further, returning to FIG. 24, a plurality of electrode layers may be formed in the empty spaces between adjacent first dielectric layers (S605). FIGS. 20-23 illustrate schematic cross-sectional views of a semiconductor structure consistent with various embodiments of the present disclosure. Specifically, the cross-sectional view shown in FIG. 20 is developed from the cross-sectional view shown in FIG. 16, the cross-sectional view shown in FIG. 21 is developed from the cross-sectional view shown in FIG. 17, and the cross-sectional views shown in FIG. 22 and FIG. 23 are two examples developed from the cross-sectional view shown in FIG. 18 and FIG. 19, respectively. It should be noted that because the electrode layers are formed between adjacent first dielectric layers, after forming the plurality of electrode layers, the plane view of the semiconductor structure remains the same as the plane view shown in FIG. 12. That is, FIG. 12 also provides a schematic plane view of the semiconductor structure after forming the plurality of electrode layers in the empty spaces between adjacent first dielectric layers.

Referring to FIGS. 12 and 20-23, a plurality of electrode layers 531 may be formed in the empty spaces between adjacent first dielectric layers 521. As such, the plurality of second dielectric layers 522 (referring to FIG. 13) formed in the array regions 503 may be replaced by the plurality of electrode layers 531, and a portion of the second dielectric layers 522 (referring to FIGS. 14-15) may be replaced by the plurality of electrode layers 531. In one embodiment, the plurality of electrode layers 531 may be made of tungsten.

In one embodiment, for two blocks 502 (for example, the second block 5022 and the third block 5023) that have the wall-structure regions 506 in contact with each other, the portion of the electrode layers 531 formed in one block 502 (for example, the second block 5022) may be isolated from the portion of the electrode layers 531 formed in the other block 502 (for example, the third block 5023) by a GLS 508 formed through the stack structure. For adjacent blocks 502 (for example, the first block 5021 and the second block 5022, or the third block 5023 and the fourth block 5024) that have the multiple fingers 504 in contact with each other, the first isolation structure 516 formed on each side of the intermediate region 501, the GLS 508 formed in the array region 503 and connected to the first isolation structure 516, and the remaining center portion of the second dielectric layers 522 in the intermediate region 501 across the two blocks 502 may electrically isolate the portion of the electrode layers 531 formed in one block 502 (for example, the first block 5021 or the third block 5023) from the portion of the electrode layers 531 formed in another block 502 (for example, the second block 5022 or the fourth block 5024).

Further, after forming the plurality of electrode layers 531, a plurality of word line contacts 512 may be formed in the intermediate region 501 to electrically connect the sub-stairs formed in the sub-staircase structure. In addition, a plurality of channel structures (not shown) may be formed in the array regions.

According to the disclosed method, the formed staircase structure includes a plurality of sub-staircase structures, and along the length direction of the wall structure, adjacent sub-staircase structures are separated from each other by a first beam structure that connects with the wall structure. The first beam structure may provide mechanical support for the wall structure, thereby preventing the wall structure from collapsing when forming a GLS through the wall structure. Moreover, for adjacent blocks that have the fingers configured between their wall-structure regions, GLSs formed between the two blocks are discontinued in the intermediate region by two first isolation structures formed respectively on the two sides of the intermediate region. In the intermediate region across the two blocks, a second beam structure connects the first isolation structure formed on each side of the intermediate region. In the second beam structure, after removing the second dielectric layers from the array regions, a portion of the second dielectric layers is retained between adjacent first dielectric layers. As such, the second dielectric layers together with the first dielectric layers located in the second beam structure not only provide mechanical support for subsequent fabrication processes and but also provide electrical isolation for the two blocks. In addition, after removing the second dielectric layers from the array regions, at least a portion of the second dielectric layers remains in each first beam structure, which also provides mechanical support for subsequent fabrication processes.

The present disclosure also provides another method for forming a memory device. FIG. 39 illustrates a flowchart of an exemplary method for forming a memory device according to various embodiments of the present disclosure. FIGS. 25-38 illustrate schematic views of semiconductor structures at certain stages of the exemplary method.

Referring to FIG. 39, a stack structure, including a plurality of first dielectric layers and a plurality of second dielectric layers that are alternately arranged over a substrate, may be formed; in a first lateral direction with respect to the substrate, the stack structure may include two array regions and an intermediate region arranged between the two array regions; in a second lateral direction with respect to the substrate, the stack structure may be divided into multiple blocks with each block including multiple fingers and a wall-structure region separating the block from an adjacent block; and adjacent blocks may have the wall-structure regions of the two blocks in contact with each other or the multiple fingers of the two blocks in contact with each other (S701).

The formation of the stack structure on the substrate may be significantly the same as the formation of the stack structure on the substrate described in the embodiments provided above, for the details of the formation of the stack structure and the definition of the plurality of blocks, the array regions, and the intermediate region, reference may be made to the corresponding description in the embodiments provided above.

Further, returning to FIG. 39, a first isolation structure may be formed through the stack structure on each side of the intermediate region between two blocks that have the fingers of both blocks configured between the wall-structure regions; a staircase structure may be formed from the stack structure in the intermediate region of the multiple fingers of the two blocks; along the first lateral direction, the staircase structure may include a plurality of sub-staircase structures, separating from each other by a first beam structure that extends along the second lateral direction and connects with the wall-structure regions of the two block; within each block and along the second lateral direction, the sub-staircase structure may include a single row of sub-stairs formed in the finger adjacent to the wall-structure region (S702).

Figure 25:
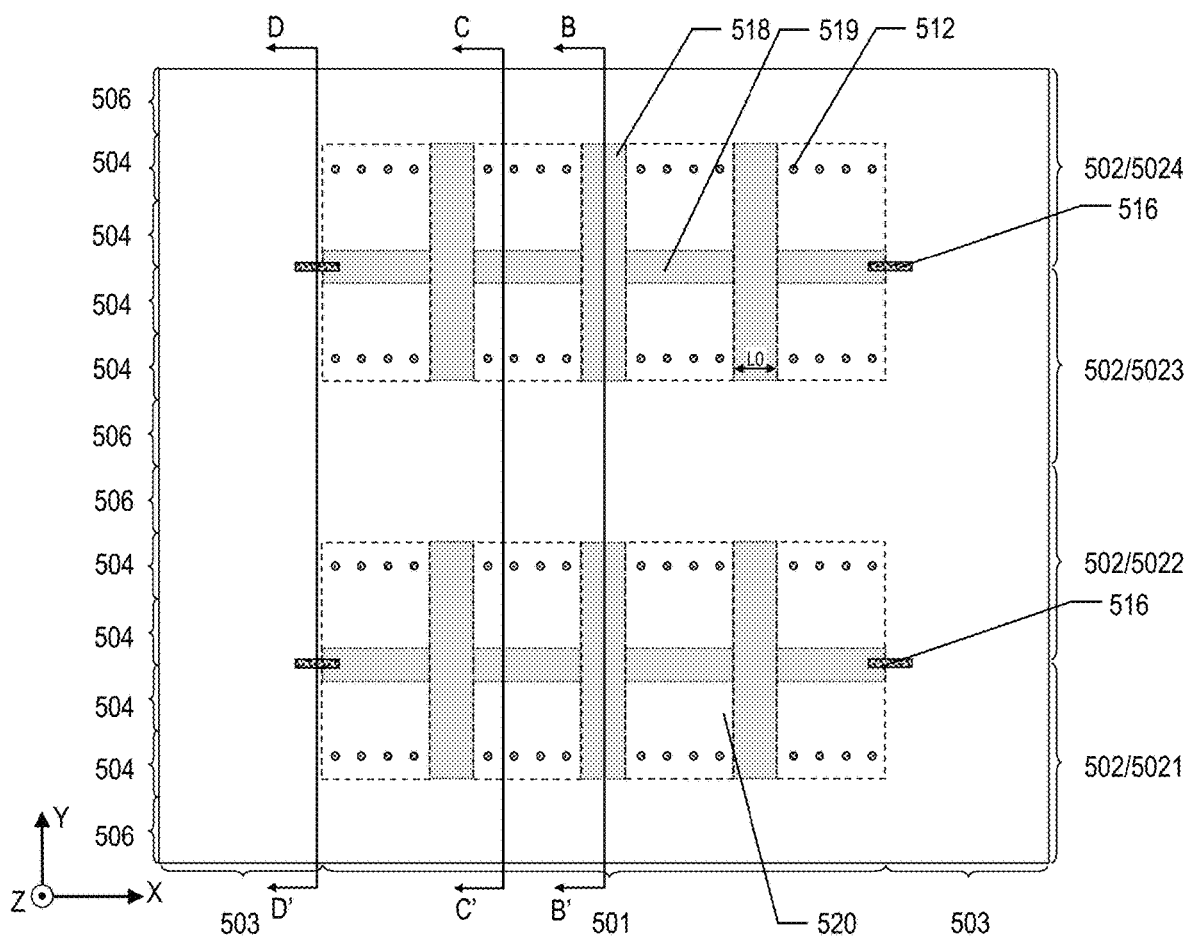
FIGS. 25-38 illustrate schematic views of semiconductor structures at certain stages of an exemplary method according to various embodiments of the present disclosure.
Figure 26:
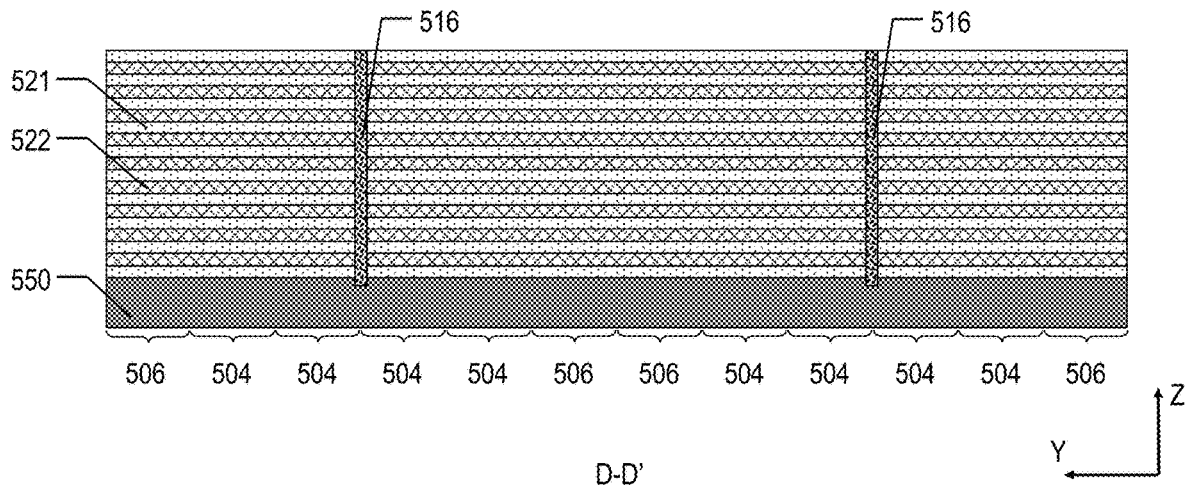
Figure 27:
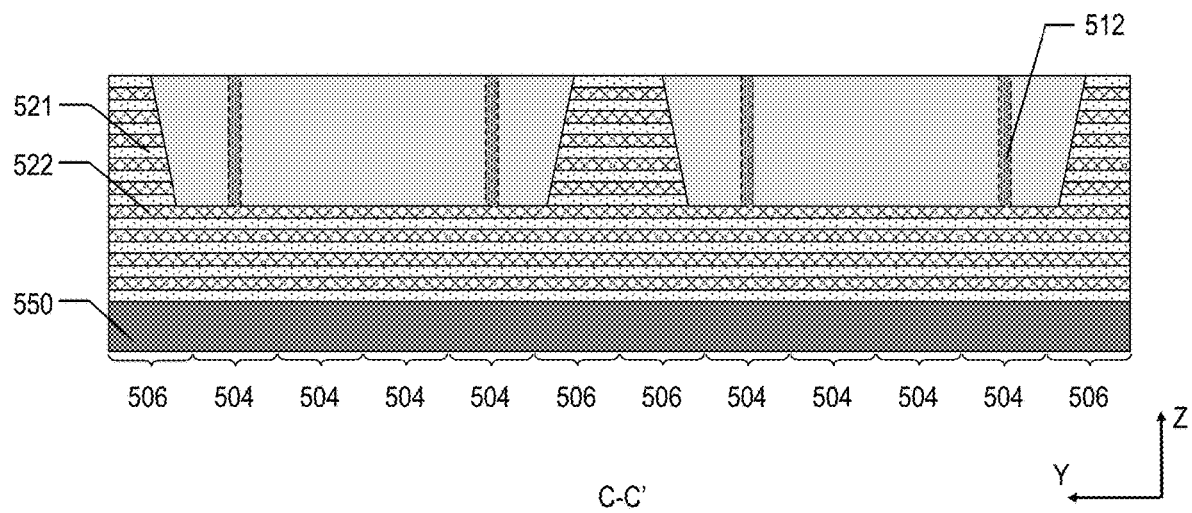
Figure 28:
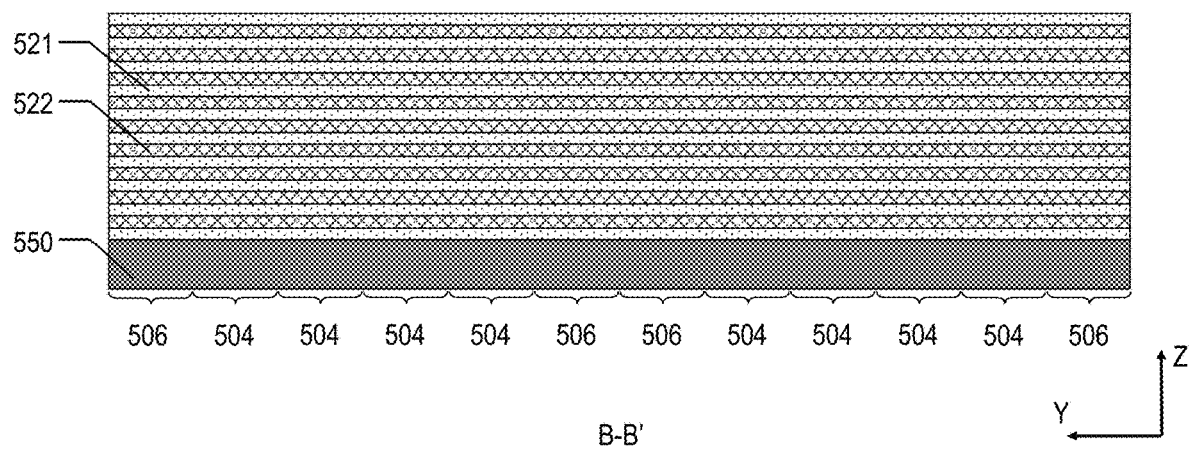

FIGS. 25-28 illustrate schematic views of an exemplary semiconductor structure according to various embodiments of the present disclosure. Specifically, FIG. 25 illustrates a schematic plane view of the semiconductor structure, FIG. 26 illustrates a schematic cross-sectional view of the semiconductor structure shown in FIG. 25 along a D-D' line, FIG. 27 illustrates a schematic cross-sectional view of the semiconductor structure shown in FIG. 25 along a C-C' line, and FIG. 28 illustrates a schematic cross-sectional view of the semiconductor structure shown in FIG. 25 along a B-B' line.

Referring to FIGS. 25-28, between two blocks 502 that have the multiple fingers 504 in contact with each other (e.g., between the block 5021 and the block 5022, and between the block 5023 and the block 5024, respectively), a first isolation structure 516 may be formed through the stack structure on each side of the intermediate region 501. Moreover, a staircase structure (not labeled) may be formed from the stack structure in the intermediate region 501 of the multiple fingers 504 of the two blocks 502; along the X-direction, the staircase structure may include a plurality of sub-staircase structures 520, and adjacent sub-staircase structures 520 may be separated from each other by a first beam structure 518 extending along the Y-direction. The first beam structure 518 may be connected to the wall-structure region 506 of each block 520. In one embodiment, in the X-direction, the width of each first beam structure 518 may be L0.

In one embodiment, within each block 502, the sub-staircase structure 520 may include a single row of sub-stairs (not shown) extending along the Y-direction. The single row of sub-stairs may be formed in the finger 504 that is adjacent to the wall-structure region 506. In a subsequent process, word line contacts 512 may be formed on the sub-stairs formed in the staircase structure. For example, the word line contacts 512 may be formed in the finger 504 adjacent to the wall-structure region 506 to electrically connect the sub-stairs formed in the finger 504. It should be noted that the word line contacts 512 may be formed in a subsequent process, and the circles in FIG. 25 and the dashed plugs in FIG. 27 are merely used to schematically indicate the intended positions for forming the word line contacts 512 in the subsequent process. It should also be noted that the portion of second dielectric layer 522 vertically under each intended word line contact 512 may be replaced with an electrode layer in a subsequent process in order to establish an electrical connection to the corresponding word line contact 512.

Referring to FIGS. 25-26, along the D-D' line in the array region 503 close to the intermediate region 501, the first isolation structure 516 formed between blocks 502 having the multiple fingers 504 in contact with each other may penetrate through the stack structure. Referring to FIGS. 25 and 27, along the C-C' line parallel to the Y-direction and cutting through a sub-staircase structure 520, a word line contact 512 may be formed in the finger 504 adjacent to the wall-structure region 506 in a subsequent process to electrically connect a corresponding stair. In addition, after forming the staircase structure including the plurality of sub-staircase structures 520, a wall structure (not labeled)

extending along the X-direction may be simultaneously formed in the intermediate region 501 between adjacent blocks 502 that have the wall-structure regions 506 in contact with each other. Therefore, the width of the wall structure (referring to FIG. 27) in the Y-direction is approximately the total width of the two adjacent wall-structure regions 506. Referring to FIGS. 25 and 28, along the B-B' line parallel to the Y-direction and cutting through a first beam structure 518 between adjacent sub-staircase structures 520, the stack structure may remain unchanged after forming the first isolation structure 516 and the staircase structure. Therefore, the first beam structures 518 extending along the Y-direction may prevent the wall structure from having a narrow width (approximately the total width of two wall-structure regions 506) all the way from one side of the intermediate region 501 to the other side of the intermediate region 501. As such, the wall structure may not easily collapse when fabricating a GLS through the wall structure along the X-direction.

For each pair of blocks 502 that have the multiple fingers 504 in contact with each other, the first isolation structure 516 formed on each side of the intermediate region 501 may be used to provide protection for the center portion of the second dielectric layers 522 in the staircase structure between the two blocks 502, such that the center portion of the second dielectric layers 522 in the staircase structure between the two blocks 502 may not be removed when replacing the second dielectric layer 522 with metallic electrode layers in a subsequent process. The remaining center portion of the second dielectric layers 522 (which may be made of a nitride) together with the first dielectric layers 521 (which may be made of an oxide) in the staircase structure between the two blocks 502 may not only provide mechanical support for the subsequent fabrication processes, but also provide electric isolation for the two blocks 502 in the formed memory device.

In one embodiment, the first isolation structure 516 may have a rectangular shape. The dimension of the first isolation structure 516 in the X-direction may be larger than a dimension of the first isolation structure 516 in the Y-direction. For example, the dimension of the first isolation structure 516 in the Y-direction may be in a range of approximately 10 nm to 40 nm. The dimension of the first isolation structure 516 in the Y-direction may not be too large, otherwise the process for filling up the corresponding opening to form the first isolation structure 516 may take more time and use more materials. The dimension of the first isolation structure 516 in the Y-direction may not be too small, otherwise the first isolation structure 516 may not be able to provide sufficient protection for the center portion of the second dielectric layers 522 in the staircase structure between the two blocks 502 during a subsequent etching process. Moreover, the dimension of the first isolation structure 516 in the X-direction may be larger than the half of the dimension of the finger 504 in the Y-direction. In addition, the dimension of each finger 504 in the Y-direction may be approximately the same as the dimension of the wall-structure region 506 in the Y-direction. In other embodiments, the first isolation structure may have any other appropriate shape.

In one embodiment, the portion of the first isolation structure 516 formed in the array region 503 may be substantially larger than the portion of the first isolation structure 516 formed in the intermediate region 501. For example, the entire first isolation structure 516 may be formed in the array region 503 with an edge overlapped with the boundary between the array region 503 and the intermediate region 501, or the portion of the first isolation structure 516 formed in the array region 503 may be two times larger than the portion of the first isolation structure 516 formed in the intermediate region 501. In other embodiments, the portion of the first isolation structure formed in the array region may be equal to or smaller than the portion of the first isolation structure formed in the wall-structure region.

The first isolation structure 516 may be made of an insulating material, e.g. silicon oxide. It should be noted that when removing the second dielectric layers 522 in a subsequent etching process, the etch rate of the material used to form the first isolation structure 516 may be substantially smaller than the etch rate of the material used to form the second dielectric layers 522.

Referring to FIG. 25, in the staircase structure formed across adjacent blocks 502 that have the multiple fingers in contact with each other, a region close to the boundary between the two blocks 502 is referred to as a second beam structure 519. In a subsequent process, after partially replacing the second dielectric layers 522 in the staircase structure with electrode layers, a portion of the second dielectric layers 522 (referring to FIG. 27) may remain in the second beam structure 519 to provide mechanical support for the material layers and electrical isolation for the two blocks 502. It should be noted that in FIG. 25, a rectangular region connecting the first isolation structure 516 formed at each side of the intermediate region 501 is used to schematically represent the position of the second beam structure 519, and in actual applications, after the plurality of second dielectric layers 522 are partially removed from the intermediate region, the remaining portion of the second dielectric layers in each sub-staircase structure 520 may have a shape different from the rectangular shape shown in FIG. 25. In addition, as shown in FIG. 27, because sub-stairs are formed in each sub-staircase structure 520, the top layer of first dielectric layer 521 located at the boundary between the block 5021 and the block 5022 or between the block 5023 and the block 5024 may be lower than the top surface of the initially formed stack structure. Therefore, the top surface of the second beam structure 519 may be lower than the top surface of the first beam structure 518. In the schematic top view shown in FIG. 25, because the first beam structure 518 and the second beam structure 519 have different height, the second beam structure 519 is displayed as discrete portions cut by the plurality of first beam structures 518.

Figure 29:
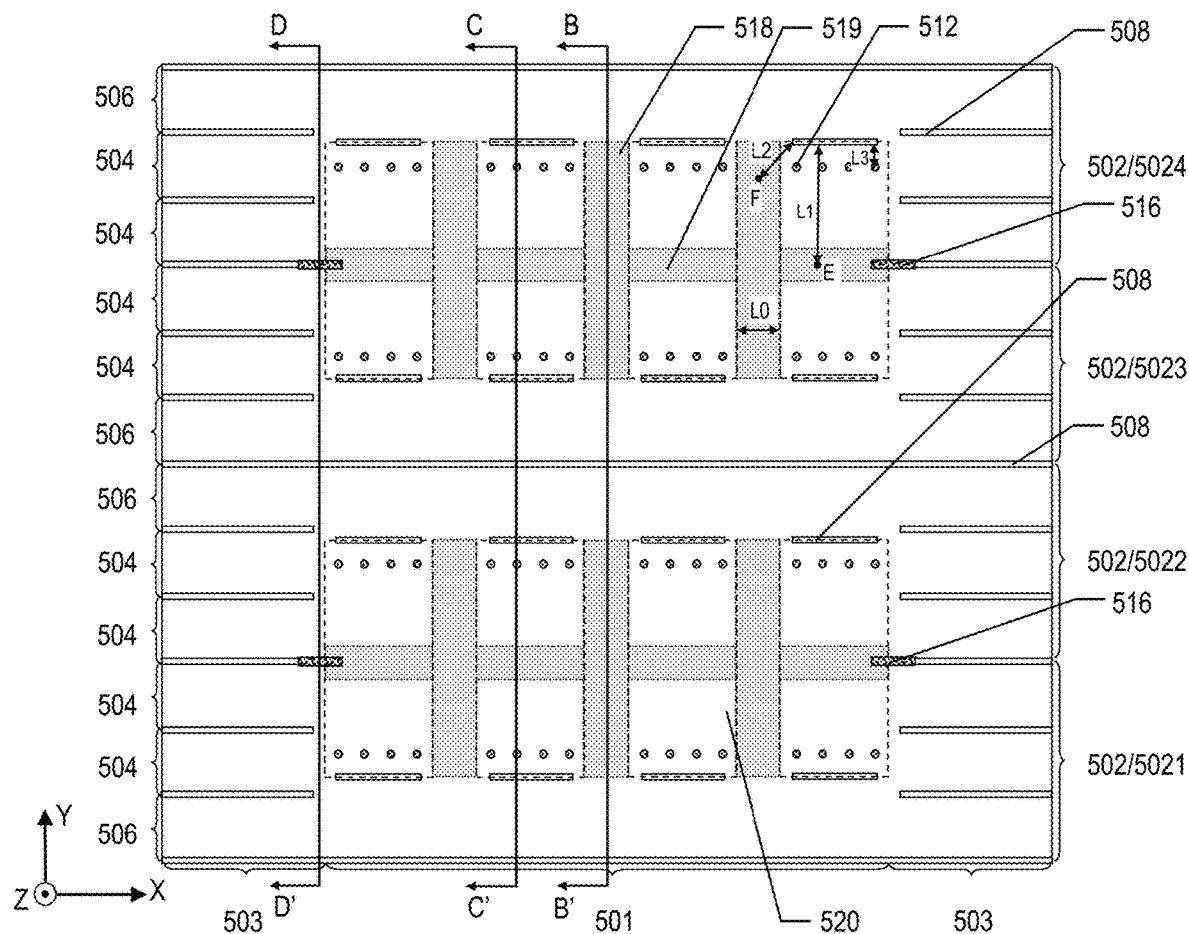
Figure 30:
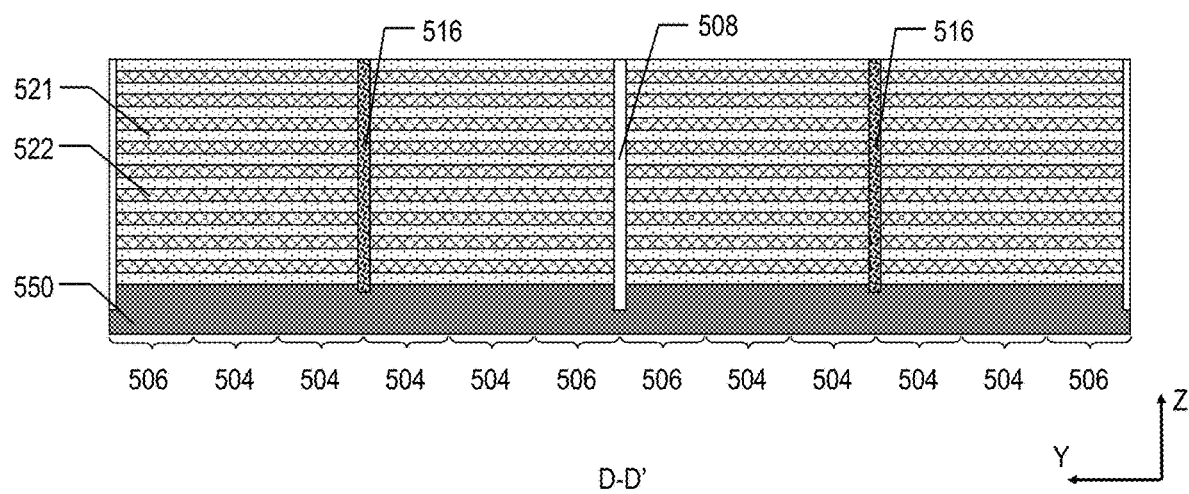
Figure 31:
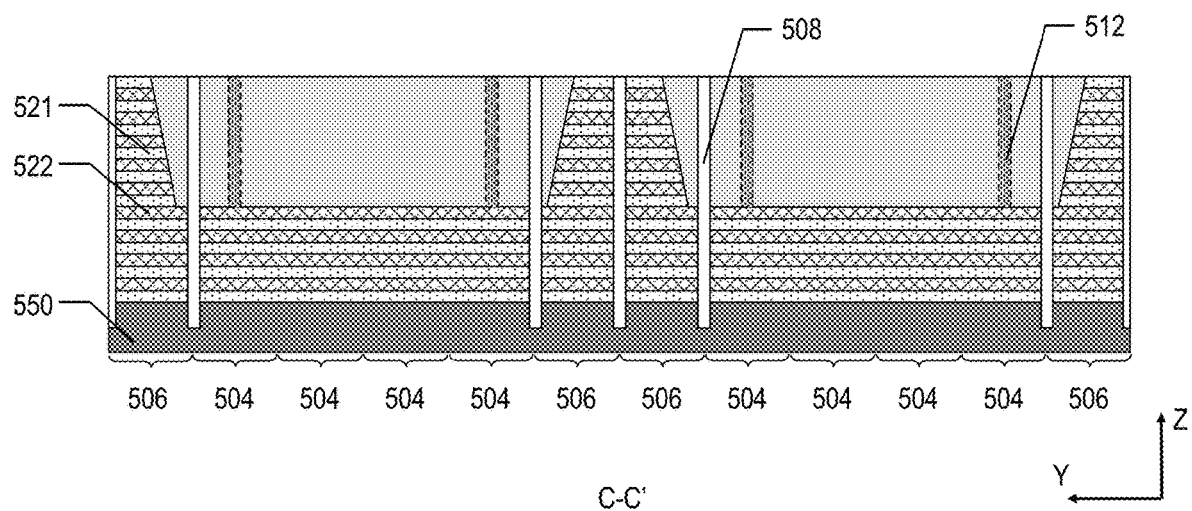
Figure 32:
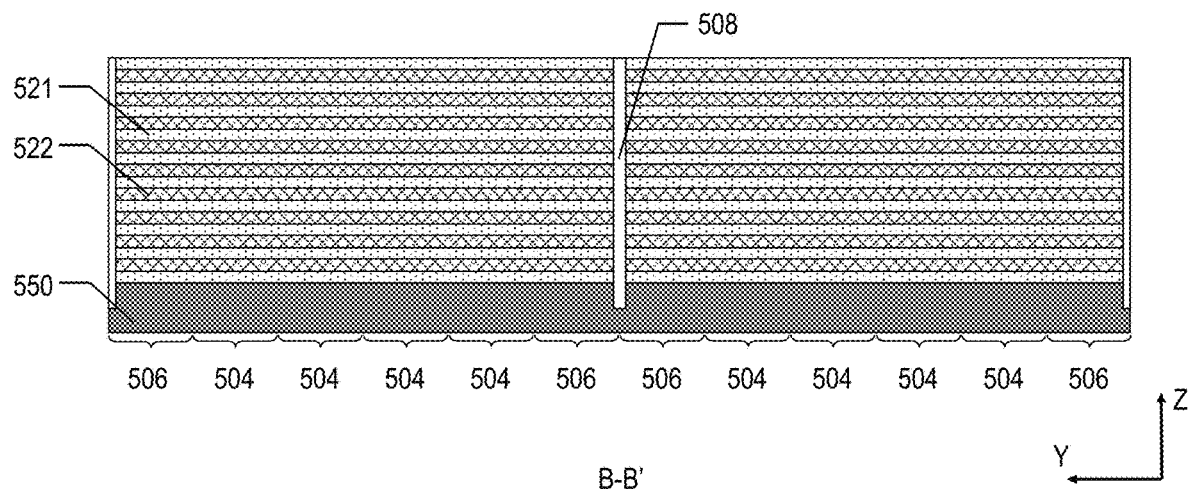

Further, returning to FIG. 39, a plurality of gate line slits (GLSs) extending along the first lateral direction may be formed vertically through the stack structure and at the boundaries of each finger and each wall-structure region of the blocks; each GLS formed between adjacent blocks that have the multiple fingers in contact with each other may be discontinued in the intermediate region by two first isolation structures formed on the two sides of the intermediate region; and within a block, each GLS formed between adjacent fingers may be limited in an array region without extending into the intermediate region (S703). FIGS. 29-32 illustrate schematic views of an exemplary semiconductor structure according to various embodiments of the present disclosure. Specifically, FIG. 29 illustrates a schematic plane view of the semiconductor structure, FIG. 30 illustrates a schematic cross-sectional view of the semiconductor structure shown in FIG. 29 along a D-D' line, FIG. 31 illustrates a schematic cross-sectional view of the semiconductor structure shown in FIG. 29 along a C-C' line, and FIG. 32 illustrates a schematic cross-sectional view of the semiconductor structure shown in FIG. 29 along a B-B' line.

Referring to FIGS. 29-32, a plurality of GLSs 508 extending along the X-direction may be formed vertically through the stack structure and at the boundaries of each finger 504 and each wall-structure region 506 of the plurality of blocks 502. The GLS 508 formed between adjacent blocks 502 that have the wall-structure regions 506 in contact with each other may extend through the array regions 503 and the intermediate region 501, and thus may electrically separate the two adjacent blocks 502. For example, referring to FIG. 29, the GLS 508 formed between the second block 5022 and the third block 5023 may extend through the entire stack structure along the X-direction.

The GLS 508 formed between adjacent blocks 502 that have the multiple fingers 504 in contact with each other may be limited in the two array regions 503. That is, on each side of the intermediate region 501, the GLS 508 formed between two blocks 502 that have the multiple fingers 504 in contact with each other may be connected to a corresponding first isolation structure 516, and thus the GLS 508 may not extend into the intermediate region 501. For example, referring to FIG. 29, between the first block 5021 and the second block 5022 or between the third block 5023 and the fourth block 5024, each GLS 508 may only be formed in an array region 503 on one side of the intermediate region 501 and may be connected to (or terminated by) a first isolation structure 516 formed on the same side of the intermediate region 501.

Moreover, within the array regions 503 of each block 502 (including the first block 5021, the second block 5022, the third block 5023, and the fourth block 5024), GLSs 508 may be formed between adjacent fingers 504 and between the wall-structure region 506 and the adjacent finger 504; and within the intermediate region 501 of each block 502, GLSs 508 may be formed between the wall-structure region 506 and the adjacent finger 504. It should be noted that within each block 502, the GLSs 508 formed in the intermediate region 501 may not be exactly located at the boundaries between the wall-structure region 506 and the adjacent finger 504; in addition, the formed GLSs 508 may not extend into the first beam structures 518 in the X-direction. For example, a GLS 508 may be formed on the edge of a sub-staircase structure 520, and the length of the GLS 508 may be smaller than the width of the sub-staircase structure 520 in the X-direction. It should also be noted that within each block 502, each GLS 508 formed in an array region 503 may extend through the entire array region 503 along the X-direction.

Referring to FIGS. 29-30, along the D-D' line in the array region 503 close to the intermediate region 501, a GLS 508 may be formed through the stack structure at the boundary between adjacent blocks 502 that have the wall-structure regions 506 in contact with each other. Referring to FIGS. 29 and 31, along the C-C' line parallel to the Y-direction and cutting through a sub-staircase structure 520, in addition to the GLS 508 formed at the boundary between two blocks 502 having the wall-structure regions 506 in contact with each other, GLSs 508 may also be formed within each block 502 to separate the wall-structure region 506 from the adjacent finger 504. It should be noted that in the intermediate region 501, GLS 508 may not be formed at the boundary between adjacent fingers 504. Referring to FIGS. 29 and 32, along the B-B' line parallel to the Y-direction and cutting through a first beam structure 518 between adjacent sub-staircase structures 520, a GLS 508 may be formed through the stack structure at the boundary between adjacent blocks 502 that have the wall-structure regions 506 in contact with each other.

The plurality of GLSs 508 may serve as a process basis for replacing the plurality of second dielectric layers 522 in the array regions 503 and the staircase structures during a subsequent process. In one embodiment, at the boundary between adjacent blocks 502 that have the multiple fingers 504 in contact with each other, the GLS 508 may be formed only in the two array regions 503 (referring to FIG. 29 and FIG. 31). Moreover, when removing the plurality of second dielectric layers 522 from the array regions 503 in a subsequent process, the first isolation structures 516 formed on the two sides of the intermediate region 501 may provide protection for the center portion of the second dielectric layers 522 in the intermediate region 501 adjacent to the boundary between the two blocks 502. Therefore, after removing the second dielectric layers 522 from the array regions 503, a center portion of the second dielectric layers 522 (located in the second beam structure 519) may remain in the intermediate region 501 between the two blocks 502 that have the multiple fingers in contact with each other. Thus, the remaining center portion of the second dielectric layers 522 in the intermediate region 501 between the two blocks 502 may provide necessary mechanical support and electrical isolation for the subsequently formed memory device. In addition, the etching process may also be able to remove the portion of the second dielectric layers 522 vertically under the intended word line contacts 512 in the finger 504 adjacent to the wall-structure region 506.

For example, referring to FIG. 29, a distance from a point E that is located in the intermediate region 501 and at the boundary between two blocks 502 (e.g. the third block 5023 and the fourth block 5024) that have the multiple fingers 504 in contact with each other to a closest GLS 508 may be L1, and a distance from the position of a to-be-formed word line contact 512 to a closest GLS 508 may be L3. In order to ensure that a center portion of the second dielectric layers 522 in the intermediate region 501 between the two blocks 502 is retained after the portion of the second dielectric layers 522 vertically under the intended word line contacts 512 is removed, L1 may be always larger than L3. That is, the shortest distance from a point located in the intermediate region 501 and at the boundary between two blocks 502 that have the multiple fingers 504 in contact with each other to a closest GLS 508 may be larger than the longest distance from a position of a to-be-formed word line contact 512 to a closest GLS 508. Similarly, in order to ensure that a center portion of the second dielectric layers 522 in the intermediate region 501 between the two blocks 502 is retained after the portion of the second dielectric layers 522 in the array regions 503 is removed, the shortest distance from a point located in the intermediate region 501 and at the boundary between two blocks 502 that have the multiple fingers 504 in contact with each other to a closest GLS 508 may be larger than the longest distance from a point located in the array regions 503 to a closest GLS 508.

Further, after the portion of the second dielectric layers 522 vertically under the intended word line contacts 512 is removed, at least a portion of the second dielectric layers 522 in the first beam structure 518 may be retained. As such, the removing portion of the second dielectric layers 522 together with the plurality of first dielectric layers 521 may provide mechanical support for the material structures in the intermediate region 501. For example, referring to FIG. 29, a distance from a point F in a first beam structure 518 to a closest GLS 508 may be L2, and in order to ensure that at least a portion of the second dielectric layers 522 in the first beam structure 518 is retained after the portion of the second dielectric layers 522 vertically under the intended word line contacts 512 is removed, the largest value of L2 may be larger than the largest value of L3. That is, the longest distance from a point located in the first beam structure 518 to a closest GLS 508 may be longer than the longest distance from a position of a to-be-formed word line contact 512 to a closest GLS 508. As such, by properly selecting the etching time, after the portion of the second dielectric layers 522 vertically under the intended word line contacts 512 is removed, at least a portion of the second dielectric layers 522 in the first beam structure 518 is retained. Similarly, in order to ensure that at least a portion of the second dielectric layers 522 in the first beam structure 518 is retained after the portion of the second dielectric layers 522 in the array regions 503 is removed, the longest distance from a point located in the first beam structure 518 to a closest GLS 508 may be longer than the longest distance from a point located in the array regions 503 to a closest GLS 508.

Because within the intermediate region 501 of each block 502, GLSs 508 may not be formed between adjacent fingers 504, during the subsequent process of removing the plurality of second dielectric layers 522, a large portion of the second dielectric layers 522 in the staircase structure may not be removed, and the remaining portion of the second dielectric layers 522, together with the plurality of first dielectric layers 521, may provide mechanical support for the material structures in the intermediate region 501.

Figure 33:
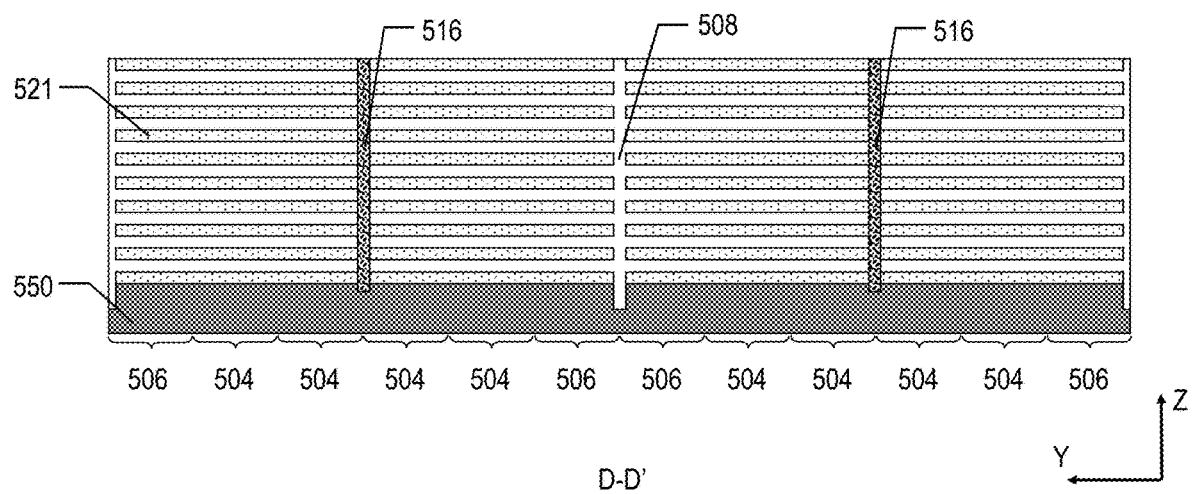
Figure 34:
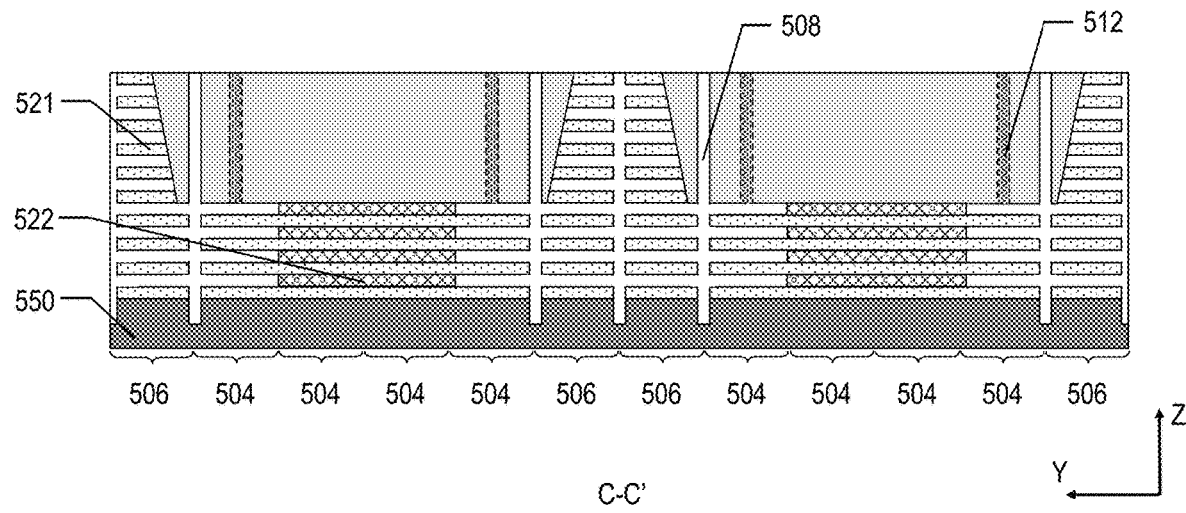
Figure 35:
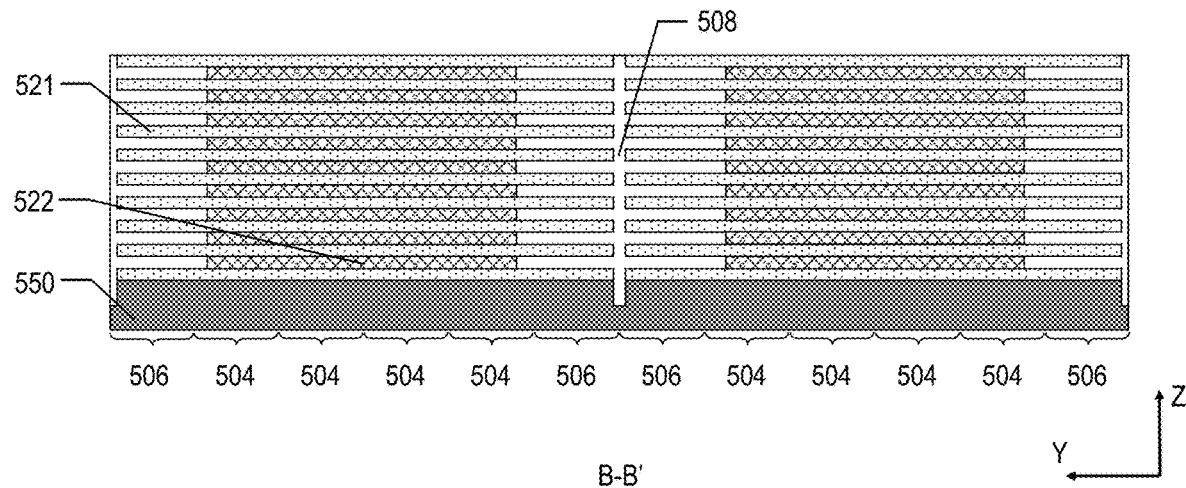

Further, returning to FIG. 39, the plurality of second dielectric layers may be removed from the array regions and partially from the intermediate region, and after removing the plurality of second dielectric layers from the array regions and partially from the staircase structure, a center portion of the second dielectric layers located in the second beam structure across adjacent blocks that have the multiple fingers in contact with each other may be retained, and at least a portion of the second dielectric layers located in each first beam structure may also be retained (S704). FIGS. 33-35 illustrate schematic cross-sectional views of a semiconductor structure consistent with various embodiments of the present disclosure. Specifically, the cross-sectional view shown in FIG. 33 is developed from the cross-sectional view shown in FIG. 30, the cross-sectional view shown in FIG. 34 is developed from the cross-sectional view shown in FIG. 31, and the cross-sectional view shown in FIG. 35 is developed from the cross-sectional view shown in FIG. 32. It should be noted that because the second dielectric layers are initially located between adjacent first dielectric layers, after removing the second dielectric layers from the array regions and partially from the intermediate region, the plane view of the semiconductor structure remains the same as the plane view shown in FIG. 29. That is, FIG. 29 also provides a schematic plane view of the semiconductor structure after removing the second dielectric layers from the array regions and partially from the staircase structure.

Referring to FIGS. 29 and 33-35, the plurality of second dielectric layers 522 may be removed from the array regions 503 and partially from the intermediate region 501. Because FIG. 33 illustrates a schematic cross-sectional view of the semiconductor structure along the D-D' line, which is in an array region 503, the plurality second dielectric layers 522 at the cross-sectional view is completely removed. As shown in FIG. 34, a center portion of the plurality of second dielectric layers 522 across the boundary between two blocks 502 that have the multiple fingers 504 in contact with each other may remain in the semiconductor structure. As shown in FIG. 35, a portion of the plurality of second dielectric layers 522 may be retained in the first beam structure 518, and each second dielectric layer 522 may continuously extend across two blocks 502 that have the multiple fingers 504 in contact with each other.

Figure 36:
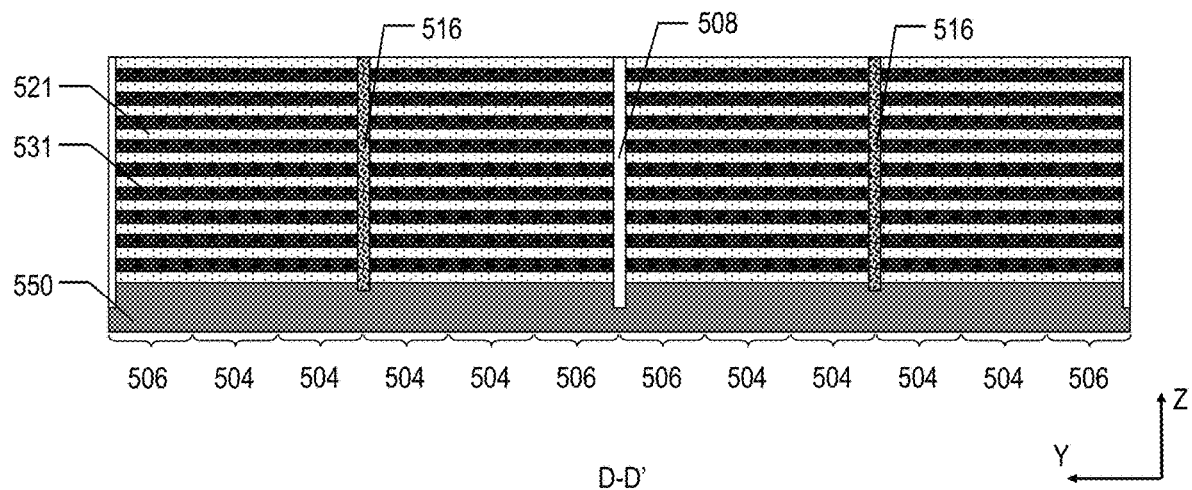
Figure 37:
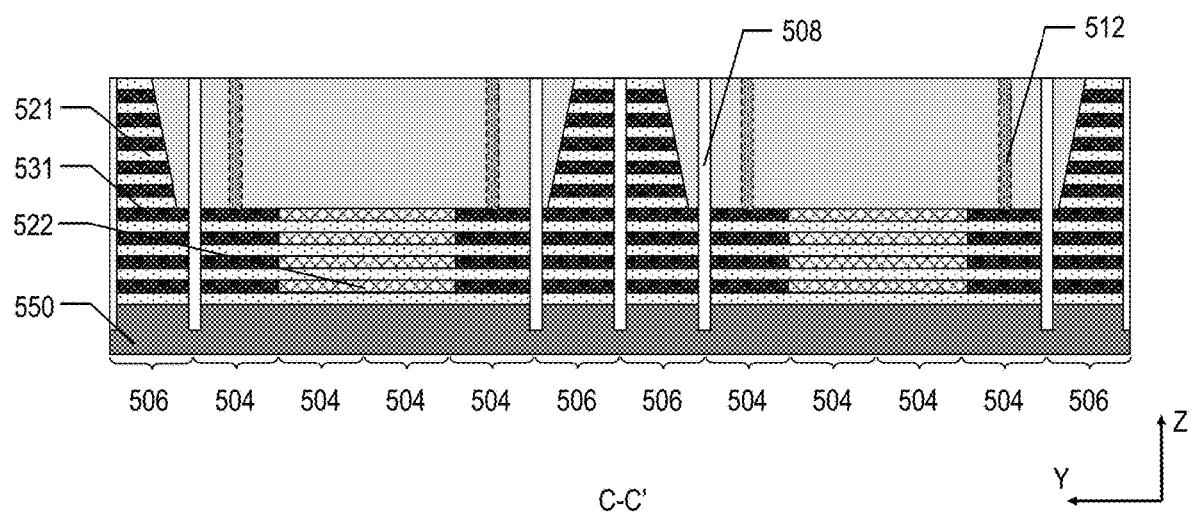
Figure 38:
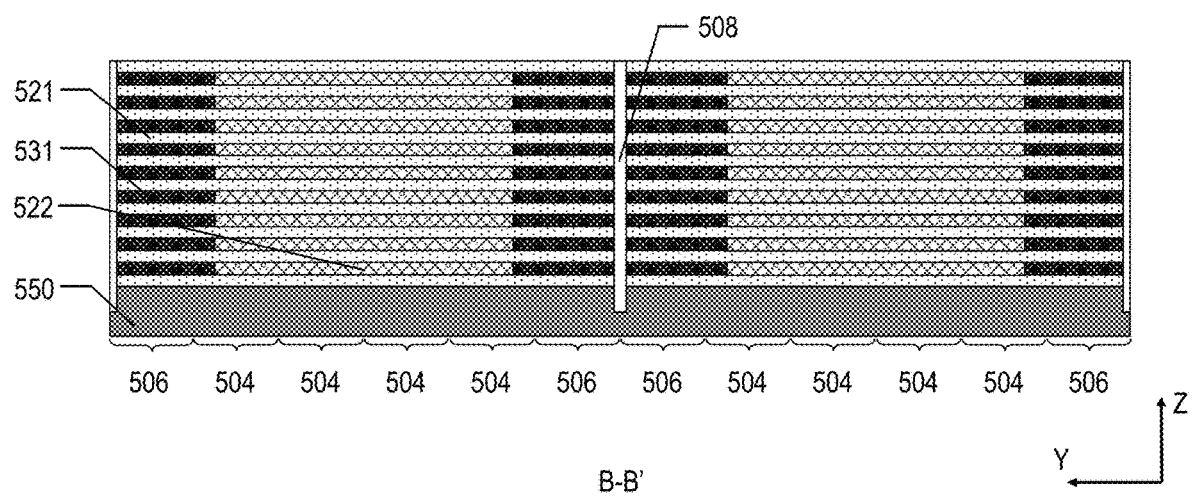

Further, returning to FIG. 39, a plurality of electrode layers may be formed in the empty spaces between adjacent first dielectric layers (S705). FIGS. 36-38 illustrate schematic cross-sectional views of a semiconductor structure consistent with various embodiments of the present disclosure. Specifically, the cross-sectional view shown in FIG. 36 is developed from the cross-sectional view shown in FIG. 33, the cross-sectional view shown in FIG. 37 is developed from the cross-sectional view shown in FIG. 34, and the cross-sectional view shown in FIG. 38 is developed from the cross-sectional view shown in FIG. 35. It should be noted that because the electrode layers are formed between adjacent first dielectric layers, after forming the plurality of electrode layers, the plane view of the semiconductor structure remains the same as the plane view shown in FIG. 29. That is, FIG. 29 also provides a schematic plane view of the semiconductor structure after forming the plurality of electrode layers in the empty spaces between adjacent first dielectric layers.

Referring to FIGS. 29 and 36-38, a plurality of electrode layers 531 may be formed in the empty spaces between adjacent first dielectric layers 521. As such, the plurality of second dielectric layers 522 (referring to FIG. 30) formed in the array regions 503 may be replaced by the plurality of electrode layers 531, and a portion of the second dielectric layers 522 (referring to FIGS. 31-32) may be replaced by the plurality of electrode layers 531. In one embodiment, the plurality of electrode layers 531 may be made of tungsten.

In one embodiment, for two blocks 502 (for example, the second block 5022 and the third block 5023) that have the wall-structure regions 506 in contact with each other, the portion of the electrode layers 531 formed in one block 502 (for example, the second block 5022) may be isolated from the portion of the electrode layers 531 formed in the other block 502 (for example, the third block 5023) by a GLS 508 formed through the stack structure. For adjacent blocks 502 (for example, the first block 5021 and the second block 5022, or the third block 5023 and the fourth block 5024) that have the multiple fingers 504 in contact with each other, the first isolation structure 516 formed on each side of the intermediate region 501, the GLS 508 formed in the array region 503 and connected to the first isolation structure 516, and the remaining center portion of the second dielectric layers 522 in the intermediate region 501 across the two blocks 502 may electrically isolate the portion of the electrode layers 531 formed in one block 502 (for example, the first block 5021 or the third block 5023) from the portion of the electrode layers 531 formed in another block 502 (for example, the second block 5022 or the fourth block 5024).

Further, after forming the plurality of electrode layers 531, a plurality of word line contacts 512 may be formed in the intermediate region 501 to electrically connect the stairs formed in the finger 504 adjacent to the wall-structure region 506. In addition, a plurality of channel structures (not shown) may be formed in the array regions.

According to the disclosed method, the formed staircase structure includes a plurality of sub-staircase structures, and along the length direction of the wall structure, adjacent sub-staircase structures are separated from each other by a first beam structure that connects with the wall structure. The first beam structure may provide mechanical support for the wall structure, thereby preventing the wall structure from collapsing when forming a GLS through the wall structure. Moreover, for adjacent blocks that have the fingers configured between their wall-structure regions, GLSs formed between the two blocks are discontinued in the intermediate region by two first isolation structures formed respectively on the two sides of the intermediate region. In the intermediate region across the two blocks, a second beam structure connects the first isolation structure formed on each side of the intermediate region. In the second beam structure, after removing the second dielectric layers from the array regions, a portion of the second dielectric layers is retained between adjacent first dielectric layers. As such, the second dielectric layers together with the first dielectric layers located in the second beam structure not only provide mechanical support for subsequent fabrication processes and but also provide electrical isolation for the two blocks. In addition, after removing the second dielectric layers from the array regions, at least a portion of the second dielectric layers remains in each first beam structure, which also provides mechanical support for subsequent fabrication processes.

Figure 40:
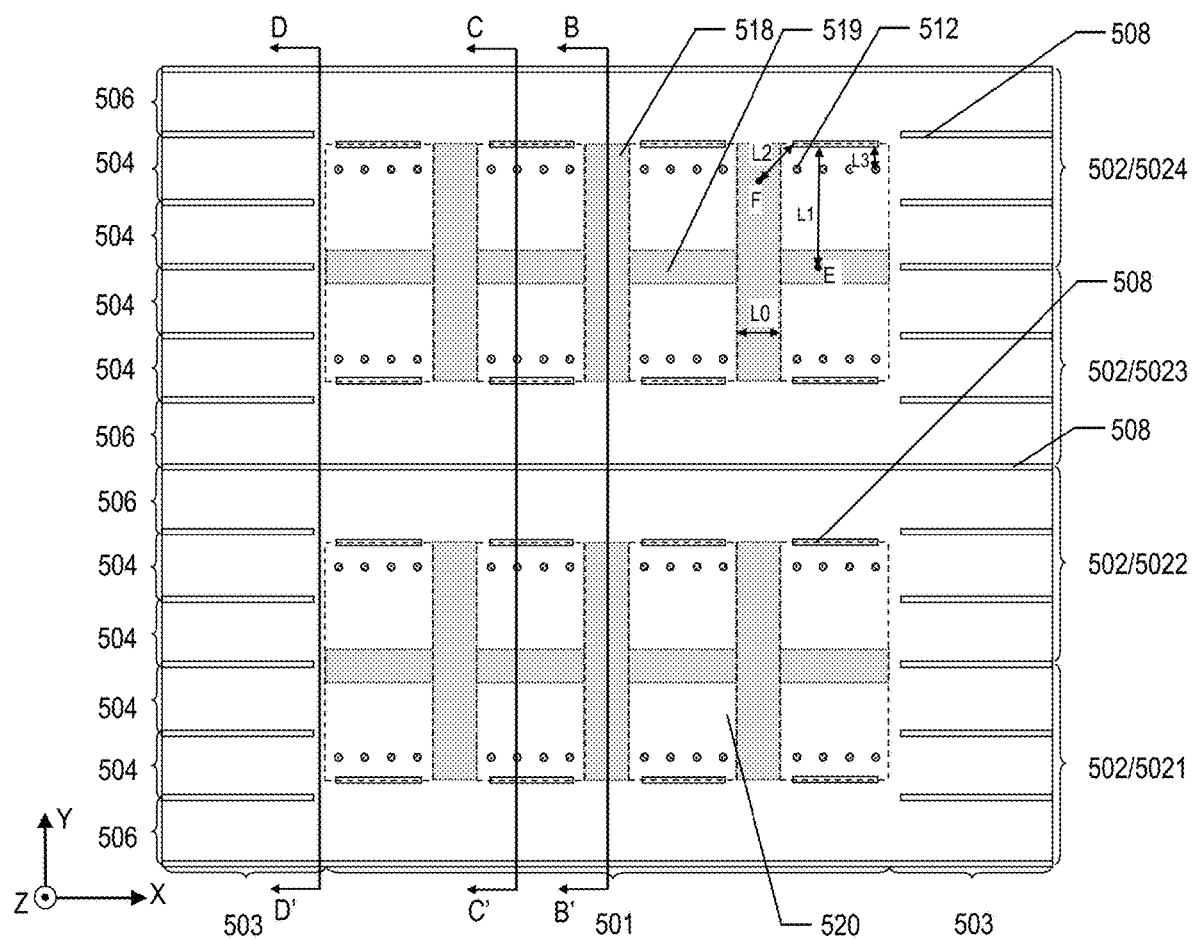
FIG. 40 illustrates a schematic top view of an exemplary semiconductor structure according to various embodiments of the present disclosure.

The present disclosure also provides another method for forming a memory device. FIG. 40 illustrates a schematic top view of a semiconductor structure fabricated by an exemplary method according to various embodiments of the present disclosure. Compared to the semiconductor structure formed by the method described in above embodiments, the method for forming the semiconductor structure shown in FIG. 40 may not include forming a first isolation structure on each side of the intermediate region 501 between adjacent blocks 502 that have the multiple fingers 504 in contact with each other along the Y-direction. Instead, when forming the plurality of GLSs 508, the GLS 508 (also referred to as the first separation structure) formed between adjacent blocks 502 that have the multiple fingers 504 in contact with each other may be located in the array regions 503. After further replacing the plurality of second dielectric layers with a plurality of electrode layers, because a plurality of electrode layers is inevitably formed at the boundary between the two blocks in the region close to the end of each first separation structure, the method may further include extending each first separation structure along the X-direction to completely remove the plurality of electrode layers formed at the boundary between the two blocks. As such, electrical isolation between the two adjacent blocks may be achieved. In one embodiment, the first separation structure (e.g. the GLS 508 formed between adjacent blocks 502 that have the multiple fingers 504 in contact with each other) may be extended by a dry etching process towards the intermediate region 501, such that the plurality of electrode layers can be completely removed from the boundary between the two blocks 502.

Figure 41:
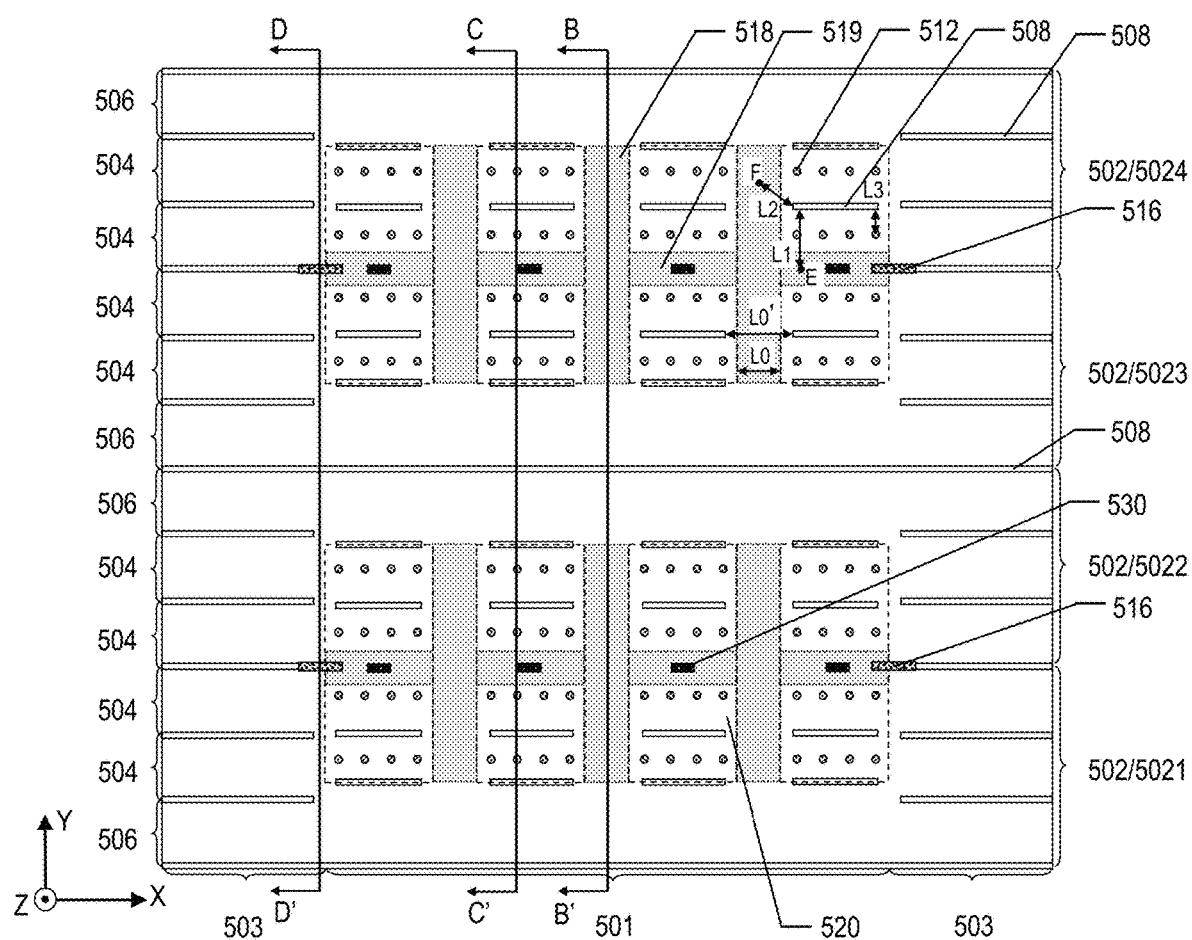
FIG. 41 illustrates a schematic top view of another exemplary semiconductor structure according to various embodiments of the present disclosure.

The present disclosure also provides another method for forming a semiconductor structure. FIG. 41 illustrates a schematic top view of a semiconductor structure fabricated by an exemplary method according to various embodiments of the present disclosure. Compared to the semiconductor structure formed by the method described in above embodiments, the method for forming the semiconductor structure shown in FIG. 41 may include forming a plurality of discrete second isolation structures 530 at the boundary between adjacent blocks 502 that have the multiple fingers 504 in contact with each other along the Y-direction. The plurality of second isolation structures 530 may be formed together with the first isolation structures 516 and thus may be made of a same material as the first isolation structures 516. For example, when forming the first isolation structure 516 on each side of the intermediate region 501 and between the two adjacent blocks 502, the plurality of discrete second isolation structures 530 may be simultaneously formed in the intermediate region 501 at the boundary between the two adjacent blocks 502. Further, after removing the plurality of second dielectric layers, a portion of the second dielectric layers 522 may remain in the staircase region 501. In the X-direction, the remaining portion of the second dielectric layers may connect adjacent second isolation structures 530 and also connect each first isolation structure 516 to a second isolation structure 530. As such, the GLS 508 (e.g., the first separation structure), the plurality of first isolation structures 516, the plurality of second isolation structure 530, and the remaining portion of the second dielectric layers may together provide electrical isolation for the two adjacent blocks 502.

The present disclosure also provides a memory device. FIG. 12 and FIGS. 20-23 illustrate schematic views of an exemplary memory device consistent with various embodiments of the present disclosure. Specifically, FIG. 12 illustrates a schematic plane view of the exemplary memory device, FIG. 20 illustrates a schematic cross-sectional view of the memory device along a D-D' line, FIG. 21 illustrates a schematic cross-sectional view of the memory device along a C-C' line, and FIGS. 22-23 illustrate two schematic examples of the cross-sectional view of the memory device along a B-B' line.

Referring to FIGS. 12 and 20-23, X, Y, and Z are used to illustrate the spatial relationship of the components in the memory device. The memory device may include a substrate 550 and a stack structure formed on the substrate 550. In a first lateral direction (the X-direction) with respect to the substrate 550, the memory device may include two array regions 503 and an intermediate region 501 arranged between the two array regions 503. In a second lateral direction (the Y-direction) with respect to the substrate 550, the memory device may be divided into multiple blocks 502. Further, in the Y-direction, each block 502 may include multiple fingers 504 together with a wall-structure region 506.

Further, adjacent blocks 502 of the plurality of blocks 502 may have the wall-structure regions 506 of the two blocks 502 in contact with each other or have the multiple fingers 504 of the two blocks 502 in contact with each other. For example, along the Y-direction, the plurality of blocks 502 may include a block 5021, a block 5022, a block 5023, and a block 5024 that are consecutively arranged along the Y-direction. The block 5021 and the block 5022 may be connected to each other with the multiple fingers 504 of the block 5021 adjacent to the multiple fingers 504 of the block 5022, the block 5022 and the block 5023 may be connected to each other with the wall-structure region 506 of the block 5022 adjacent to the wall-structure region 506 of the block 5023, and the block 5023 and the block 5024 may be connected to each other with the multiple fingers 504 of the block 5023 adjacent to the multiple fingers 504 of the block 5024. It should be noted that four blocks 502 (the block 5021, the block 5022, the block 5023, and the block 5024) are shown in FIG. 12 for illustration, and in actual applications, the semiconductor structure may at least include two blocks that have the multiple fingers in contact with each other. It should also be noted that only a part of each array region 503 that is adjacent to the intermediate region 501 is shown in FIG. 12.

The stack structure may include a plurality of first dielectric layers 521 and a plurality of electrode layers 531. The plurality of first dielectric layers 521 and the plurality of electrode layers 531 may be alternately stacked on the substrate 550. In one embodiment, the substrate 550 may be made of silicon, germanium, silicon germanium, or any other appropriate semiconductor material. In other embodiments, the substrate may be made of SOI, GOI, or any other appropriate semiconductor composite. In one embodiment, the plurality of first dielectric layers 521 may be made of an oxide, e.g. silicon oxide, and the plurality of electrode layers 531 may be made of a conductive material, e.g. tungsten.

In the intermediate region 501, the stack structure may include a wall structure (not labeled) formed by the wall-structure regions 506 of adjacent blocks 502 that have the wall-structure regions 506 in contact with each other.

Further, the memory device may include a first isolation structure 516 formed through the stack structure on each side of the intermediate region 501 between adjacent blocks 502 that have the multiple fingers 504 in contact with each other.

In one embodiment, the first isolation structure 516 may have a rectangular shape, and may be made of an insulating material, e.g. silicon oxide. The dimension of the first isolation structure 516 in the X-direction may be larger than a dimension of the first isolation structure 516 in the Y-direction. For example, the dimension of the first isolation structure 516 in the Y-direction may be in a range of approximately 10 nm to 40 nm. Moreover, the dimension of the first isolation structure 516 in the X-direction may be larger than the half of the dimension of the finger 504 in the Y-direction. In other embodiments, the first isolation structure may have any other appropriate shape.

In one embodiment, the portion of the first isolation structure 516 formed in the array region 503 may be substantially larger than the portion of the first isolation structure 516 formed in the intermediate region 501. For example, the entire first isolation structure 516 may be formed in the array region 503 with an edge overlapped with the boundary between the array region 503 and the intermediate region 501, or the portion of the first isolation structure 516 formed in the array region 503 may be two times larger than the portion of the first isolation structure 516 formed in the intermediate region 501. In other embodiments, the portion of the first isolation structure formed in the array region may be equal to or smaller than the portion of the first isolation structure formed in the wall-structure region.

Further, in the intermediate region 501, the stack structure may also include a staircase structure (not labeled) formed in the multiple fingers 504 of adjacent blocks 502 that have the multiple fingers 504 in contact with each other. Along the X-direction, the staircase structure may include a plurality of sub-staircase structures 520, and adjacent sub-staircase structures 520 may be separated from each other by a first beam structure 518 extending along the Y-direction. Along the Y-direction, the first beam structure 518 may be connected to the wall-structure region 506 of each block 502. In one embodiment, in the X-direction, the width of each first beam structure 518 may be L0, and within each block 502, the sub-staircase structure 520 may include a plurality of rows of sub-stairs (not shown) extending along the Y-direction. Each sub-stair may include a plurality of pairs of the first dielectric layer 521 and the electrode layer 531.

Moreover, at least a portion of each first beam structure 518 may include a stack structure formed by the plurality of first dielectric layers 521 alternated with a plurality of second dielectric layers 522. That is, in each first beam structure 518, a second dielectric layer 522 and an electrode layer 531 may be connected to each other and located between the same pair of first dielectric layers 521. The plurality of second dielectric layers 522 may be made of a nitride, e.g. silicon nitride. In one embodiment, referring to FIG. 22, along the Y-direction, each second dielectric layer may continuously extend across the two blocks 502 that have the multiple fingers 504 in contact with each other. In other embodiments, referring to FIG. 23, along the Y-direction, each second dielectric layer 522 may include a plurality of discrete sub-portions, and the plurality of second dielectric layers 522, together with the plurality of first dielectric layers 521, may form multiple vertical pillars, which may further provide mechanical support for the memory device.

Further, in the intermediate region 501, the memory device may include a second beam structure 519 located across adjacent blocks 502 that have the multiple fingers 504 in contact with each other. The second beam structure 519 may connect the first isolation structure 516 located on one side of the intermediate region 501 to another first isolation structure 516 located on the other side of the intermediate region 501. Moreover, in the second beam structure 519, the memory device may also include a plurality of second dielectric layers 522 alternated with the plurality of first dielectric layers 521. It should be noted that the boundary between adjacent blocks 502 that have the multiple fingers 504 in contact with each other may be located in the staircase structure, the top layer of the plurality of second dielectric layers 522 may be lower than the top layer of the plurality of electrode layers 531 located in the wall structure. The plurality of second dielectric layers 522 may be connected to the first isolation structure 516 formed on each side of the intermediate region 501.

The memory device may further include a plurality of GLSs 508 formed vertically through the stack structure and extending along the X-direction. The plurality of GLSs 508 may include GLSs 508 formed between adjacent blocks 502 that have the wall-structure regions 506 in contact with each other. The GLSs 508 formed between adjacent blocks 502 that have the wall-structure regions 506 in contact with each other may extend through the two array regions 503 as well as the intermediate region 501 to electrically separate the two adjacent blocks 502.

The plurality of GLSs 508 may also include GLSs 508 formed between adjacent blocks 502 that have the multiple fingers 504 in contact with each other. Each GLS 508 formed between adjacent blocks 502 that have the multiple fingers 504 in contact with each other may be limited in an array regions 503 and may be connected to a corresponding first isolation structure 516 on the same side of the intermediate region 501. In one embodiment, the first isolation structure 516 formed on each side of the intermediate region 501, the GLS 508 formed in the array region 503 and connected to the first isolation structure 516, and the plurality of first dielectric layers 521 and the plurality of second dielectric layers 522 in the intermediate region 501 across the two blocks 502 may electrically isolate adjacent blocks 502 that have the multiple fingers 504 in contact with each other.

Within each block 502, the plurality of GLSs 508 may also include GLSs 508 formed between adjacent fingers 504 and also between the wall-structure region 506 and the adjacent finger 504. It should be noted that within each block 502, the GLSs 508 formed in the intermediate region 501 may not be exactly located at the boundaries between adjacent fingers 504 or between the wall-structure region 506 and the adjacent finger 504; in addition, the formed GLSs 508 may not extend into the first beam structures 518 in the X-direction. It should also be noted that within each block 502, each GLS 508 formed in an array region 503 may extend through the entire array region 503 along the X-direction.

Further, referring to FIG. 12, a distance from a point E that is located in the intermediate region 501 and at the boundary between two blocks 502 (e.g. the third block 5023 and the fourth block 5024) that have the multiple fingers 504 in contact with each other to a closest GLS 508 may be L1, and a distance from the position of a to-be-formed word line contact 512 to a closest GLS 508 may be L3. In one embodiment, L1 may be always larger than L3. That is, the shortest distance from a point located in the intermediate region 501 and at the boundary between two blocks 502 that have the multiple fingers 504 in contact with each other to a closest GLS 508 may be larger than the longest distance from a position of a to-be-formed word line contact 512 to a closest GLS 508. Similarly, the shortest distance from a point located in the intermediate region 501 and at the boundary between two blocks 502 that have the multiple fingers 504 in contact with each other to a closest GLS 508 may be larger than the longest distance from a point located in the array regions 503 to a closest GLS 508.

Further, referring to FIG. 12, a distance from a point F in a first beam structure 518 to a closest GLS 508 may be L2. In one embodiment, the largest value of L2 may be larger than the largest value of L3. That is, the longest distance from a point located in the first beam structure 518 to a closest GLS 508 may be longer than the longest distance from a position of a to-be-formed word line contact 512 to a closest GLS 508. As such, by properly selecting the etching time, after the portion of the second dielectric layers 522 vertically under the intended word line contacts 512 is removed, at least a portion of the second dielectric layers 522 in the first beam structure 518 is retained. Similarly, in order to ensure that at least a portion of the second dielectric layers 522 in the first beam structure 518 is retained after the portion of the second dielectric layers 522 in the array regions 503 is removed, the longest distance from a point located in the first beam structure 518 to a closest GLS 508 may be longer than the longest distance from a point located in the array regions 503 to a closest GLS 508.

In one embodiment, referring to FIG. 12, in the X-direction, the GLSs 508 formed in each sub-staircase structure 520 between adjacent fingers 504 or between a wall-structure region 506 and a finger 504 may be equal to or shorter than the dimension of the sub-staircase structure 520. Therefore, in the X-direction, the distance L0' between GLSs 508 may be equal to larger than the distance L0 between sub-staircase structures 520. That is, the length of each GLS 508 formed in the sub-staircase structure 520 may be equal to or smaller than the width of the sub-staircase structure 520 in the X-direction.

Further, the memory device may include a plurality of word line contacts 512 formed in the intermediate region 501 to electrically connect the plurality of rows of sub-stairs. For example, the word line contacts 512 may be formed in each finger 504 to electrically connect the sub-stairs formed in the finger 504.

According to the disclosed memory device, the formed staircase structure includes a plurality of sub-staircase structures, and along the length direction of the wall structure, adjacent sub-staircase structures are separated from each other by a first beam structure that connects with the wall structure. The first beam structure may provide mechanical support for the wall structure, thereby preventing the wall structure from collapsing when forming a GLS through the wall structure. Moreover, for adjacent blocks that have the fingers configured between their wall-structure regions, GLSs formed between the two blocks are discontinued in the intermediate region by two first isolation structures formed respectively on the two sides of the intermediate region. In the intermediate region across the two blocks, a second beam structure connects the first isolation structure formed on each side of the intermediate region. In the second beam structure, after removing the second dielectric layers from the array regions, a portion of the second dielectric layers is retained between adjacent first dielectric layers. As such, the second dielectric layers together with the first dielectric layers located in the second beam structure not only provide mechanical support for subsequent fabrication processes and but also provide electrical isolation for the two blocks. In addition, after removing the second dielectric layers from the array regions, at least a portion of the second dielectric layers remains in each first beam structure, which also provides mechanical support for subsequent fabrication processes.

The present disclosure also provides another memory device. FIG. 29 and FIGS. 36-38 illustrate schematic views of an exemplary memory device consistent with various embodiments of the present disclosure. Specifically, FIG. 29 illustrates a schematic plane view of the exemplary memory device, FIG. 36 illustrates a schematic cross-sectional view of the memory device along a D-D' line, FIG. 37 illustrates a schematic cross-sectional view of the memory device along a C-C' line, and FIG. 38 illustrates a schematic cross-sectional view of the memory device along a B-B' line.

Referring to FIGS. 29 and 36-39, the memory device is substantially same as the memory device described in the embodiments provided above. The following description will be focused on the differences between the memory devices, and the similar components will not be described herein again. For the details of the similar components, reference may be made to corresponding description in the embodiments provided above.

Referring to FIG. 29, within each block 502 of the memory device, the sub-staircase structure 520 may include a single row of sub-stairs (not shown) extending along the Y-direction. The single row of sub-stairs may be formed in the finger 504 that is adjacent to the wall-structure region 506. Each sub-stair may include a plurality of pairs of the first dielectric layer 521 and the electrode layer 531. Accordingly, the word line contacts 512 may be formed in the finger 504 that is adjacent to the wall-structure region 506. Moreover, within the intermediate region 501 of each block 502, the GLSs 508 may only be formed between the wall-structure region 506 and the adjacent finger 504. Referring to FIGS. 37-38, without forming GLSs 508 between adjacent fingers 504 in the intermediate region 501, the plurality of second dielectric layers 522 located in the intermediate region 501 across adjacent blocks 502 that have the multiple fingers in contact with each other may be wide in the Y-direction; and the plurality of second dielectric layers 522 located in the first beam structure 518 may also be continuous, and may thus have a large dimension in the Y-direction.

According to the fabrication method of the memory device, the plurality of second dielectric layers 522 may initially occupy the space between adjacent first dielectric layers 521. Further, a portion of the second dielectric layers 522 may be removed and the plurality of electrode layers 531 may then be formed to fill the space created by removing the second dielectric layers 522. Moreover, because the etching process for removing the portion of the second dielectric layers 522 may be an isotropic wet etching process and may start etching from the plurality of GLSs 508. Therefore, by designing the pattern of the plurality of GLSs 508 and properly selecting the etching time, the portion of the second dielectric layers 522 retained after the etching process may be controllable. In one embodiment, because the sub-staircase structure 520 in each block 502 may only include a single row of sub-stairs formed in the finger 504 that is adjacent to the wall-structure region 506, the portion of the second dielectric layers 522 initially formed in the intermediate region 501 of the fingers 504 that are not in contact with the wall-structure region 506 may not need to be removed. Therefore, in the intermediate region 501, the GLSs 508 may not need to be formed between adjacent fingers 504. As such, the plurality of second dielectric layers 522 located in the intermediate region 501 across adjacent blocks 502 that have the multiple fingers in contact with each other may be wide in the Y-direction, and the plurality of second dielectric layers 522 located in the first beam structure 518 may not be discontinued in the Y-direction.

According to the disclosed memory device, the formed staircase structure includes a plurality of sub-staircase structures, and along the length direction of the wall structure, adjacent sub-staircase structures are separated from each other by a first beam structure that connects with the wall structure. The first beam structures may provide mechanical support for the wall structure, thereby preventing the wall structure from collapsing when a GLS is formed through the wall structure. Moreover, for adjacent blocks that have the multiple fingers in contact with each other, GLSs formed between the two blocks are discontinued in the intermediate region by two first isolation structures formed respectively on the two sides of the intermediate region. In addition, a plurality of second dielectric layers is located in a second beam structure across blocks that have the multiple fingers in contact with each other. In the second beam structure, the plurality of second dielectric layers is alternated with the plurality of first dielectric layers. The stack structure of the first dielectric layers and the second dielectric layers is connected to the first isolation structures formed on the two sides of the intermediate region, and thus provides mechanical support for the material structure in the intermediate region. The first isolation structure, the GLS formed in the array region and connected to the first isolation structure, together with the plurality of first dielectric layers and the plurality of second dielectric layers formed in the second beam structure across adjacent blocks that have the multiple fingers in contact with each other provide electrical isolation for the two blocks. In addition, a portion of the second dielectric layers disposed in each first beam structure also provides mechanical support for the material structure in the intermediate region.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory device, comprising:
   a substrate;
   a stack structure, including a plurality of first dielectric layers and a plurality of electrode layers that are alternately arranged over the substrate, wherein:
      in a first lateral direction with respect to the substrate, the memory device includes array regions and an intermediate region arranged between the array regions, and
      in a second lateral direction with respect to the substrate, the stack structure includes a first block and a second block, each including a wall-structure region, wherein in the intermediate region, wall-structure regions of the first block and the second block are separated by a staircase structure;
   a beam structure, located in the intermediate region and including at least a plurality of discrete first beam structures, each extending along the second lateral direction and connecting the wall-structure regions of the first block and the second block; and
   a plurality of second dielectric layers, located in the beam structure, wherein in the plurality of discrete first beam structures, the plurality of second dielectric layers is alternated with the plurality of first dielectric layers.

2. The memory device according to claim 1, wherein:
   the beam structure further includes a second beam structure, disposed across the first block and the second block and extending through the intermediate region in the first lateral direction, wherein:
      in the second beam structure, the plurality of second dielectric layers is alternated with the plurality of first dielectric layers.

3. The memory device according to claim 2, further including:
   a first isolation structure, formed vertically through the stack structure on each side of the intermediate region along the first lateral direction and between the first block and the second block along the second lateral direction, wherein:
      the first isolation structure is made of silicon oxide.

4. The memory device according to claim 1, wherein:
   along the first lateral direction, the staircase structure includes a plurality of sub-staircase structures, and adjacent sub-staircase structures are separated by one of the plurality of discrete first beam structures.

5. The memory device according to claim 4, further including:
   a first separation structure, formed vertically through the stack structure and positioned between the first block and the second block in each array region along the first lateral direction, wherein the first block includes a first edge opposite to the second block, and the second block includes a second edge opposite to the first block; and
   a second separation structure formed on each of the first edge and the second edge and extending through the array regions and the staircase region.

6. The memory device according to claim 5, wherein each of the first block and the second block further includes:
   a plurality of fingers, extending along the first lateral direction, wherein:
      in the second lateral direction, the plurality of fingers of the first block and the plurality of fingers of the second block are located between; and
   the memory device further includes a plurality of third separation structures formed within each of the first block and the second block and between the wall-structure region and an adjacent finger, wherein:
      in each array region of the first block or the second block, a third separation structure extends through the array region; and
      in the intermediate region of the first block or the second block, a third separation structure is disposed at an edge of each sub-staircase structure close to the wall-structure region, wherein a length of the third separation structure is shorter than or equal to a width of the sub-staircase structure.

7. The memory device according to claim 6, wherein:
within the first block or the second block, each sub-staircase structure includes a plurality of stairs formed in a finger adjacent to the wall-structure region; and
the memory device further includes a plurality of word line contacts formed in the finger adjacent to the wall-structure region to electrically connect the plurality of stairs.

8. The memory device according to claim 7, further including:
a plurality of fourth separation structures formed within each of the first block and the second block and between adjacent fingers, wherein:
in each array region of the first block or the second block, a fourth separation structure extends through the array region; and
in the intermediate region of the first block or the second block and between adjacent fingers, a fourth separation structure is disposed in each sub-staircase structure, wherein a length of the fourth separation structure is shorter than or equal to a width of the sub-staircase structure.

9. The memory device according to claim 8, wherein:
within the first block or the second block, each sub-staircase structure includes a plurality of stairs formed in each finger of the plurality of fingers; and
the memory device further includes a plurality of word line contacts formed in each finger of the plurality of fingers to electrically connect the plurality of stairs.

10. The memory device according to claim 6, wherein:
along the second lateral direction, each second dielectric layer of the plurality of second dielectric layers in the first beam structure includes a plurality of discrete sub-portions.

11. The memory device according to claim 3, wherein:
a dimension of the first isolation structure in the first lateral direction is larger than a half of a dimension of each finger of the plurality of fingers in the second lateral direction; and
a dimension of the first isolation structure in the second lateral direction is in a range of approximately 10 nm to 40 nm.

12. The memory device according to claim 3, further including:
a plurality of second isolation structures formed between the first block and the second block along the first lateral direction, wherein:
the plurality of second dielectric layers connects adjacent second isolation structures and connects each first isolation structure to a second isolation structure.

13. A method for forming a memory device, comprising:
forming a stack structure, including a plurality of first dielectric layers and a plurality of second dielectric layers that are alternately arranged over a substrate, wherein:
in a first lateral direction with respect to the substrate, the stack structure is formed in array regions and an intermediate region arranged between the array regions;
forming a staircase structure and a plurality of discrete first beam structures in the intermediate region along a second lateral direction with respect to the substrate;
forming a plurality of gate line slits (GLSs), vertically through the stack structure and into the substrate, and extending along the first lateral direction, wherein:
in the second lateral direction, the plurality of GLSs at least defines a first block and a second block, and
the plurality of GLSs includes a GLS formed in each array region at a boundary between the first block and the second block; and
removing the plurality of second dielectric layers from the array regions and partially from the intermediate region, wherein:
after removing the plurality of second dielectric layers from the array regions and partially from the intermediate region, a portion of the plurality of second dielectric layers remains in the plurality of discrete first beam structures.

14. The method according to claim 13, further including:
forming a second beam structure across the first block and the second block and extending through the intermediate region in the first lateral direction, wherein:
after removing the plurality of second dielectric layers from the array regions and partially from the intermediate region, a portion of the plurality of second dielectric layers remains in the second beam structure; and
forming a first isolation structure vertically through the stack structure between the first block and the second block, wherein:
the first isolation structure located at a boundary between each array region and the intermediate region; and
the first isolation structure is connected with the GLS formed in each array region on a side adjacent to the intermediate region, and the remaining portion of the plurality of second dielectric layers in the second beam structure connects the first isolation structure on each side of the intermediate region.

15. The method according to claim 13, wherein:
along the first lateral direction, the staircase structure includes a plurality of sub-staircase structures, and adjacent sub-staircase structures are separated by one of the plurality of discrete first beam structures.

16. The method according to claim 13, wherein each of the first block and the second block includes:
a wall-structure region and a plurality of fingers, extending along the first lateral direction, wherein:
the plurality of fingers of the first block and the plurality of fingers of the second block are adjacent to each other,
the staircase structure is located in the intermediate region between the wall-structure regions of the first block and the second block,
in the second lateral direction, each first beam structure extends through the plurality of fingers of the first block and the plurality of fingers of the second block and connects to the wall-structure regions of the first block and the second block.

17. The method according to claim 13, further including:
forming a plurality of electrode layers between adjacent first dielectric layers after the plurality of second dielectric layers are removed from the array regions and partially from the intermediate region, wherein:
the first isolation structure is made of an insulating material.

18. The method according to claim 14, when forming the first isolation structure vertically through the stack structure and at the boundary between each array region and the intermediate region, further including:
forming a plurality of second isolation structures in the intermediate region, wherein:

in the second lateral direction, each second isolation structure of the plurality of second isolation structures is aligned with the first isolation structure;

the first isolation structure and the plurality of second isolation structures are made of an insulating material; and after removing the plurality of second dielectric layers from the array regions and partially from the intermediate region, the remaining portion of the plurality of second dielectric layers in the second beam structure connects adjacent second isolation structures and also connects each first isolation structure to a second isolation structure.

19. The method according to claim 16, wherein:

the first block includes a first edge opposite to the second block, and the second block includes a second edge opposite to the first block;

the plurality of GLSs further includes a GLS formed on the first edge and extending through the array regions and the intermediate region, and a GLS formed on the second edge and extending through the array regions and the intermediate region; and within each of the first block and the second block, the plurality of GLSs extending along the first lateral direction further includes:
- a GLS located in each array region and between the wall-structure region and an adjacent finger;
- GLSs formed in each array region and between adjacent fingers, wherein along the first lateral direction, each GLS formed in an array region and between adjacent fingers extends through the array region; and
- a GLS located in the intermediate region and at an edge of each sub-staircase structure close to the wall-structure region, wherein a length of the GLS located in the intermediate region and at the edge of each sub-staircase structure close to the wall-structure region is shorter than or equal to a width of the sub-staircase structure.

20. The memory device according to claim 19, wherein:

within the first block or the second block, each sub-staircase structure includes a plurality of stairs formed in a finger adjacent to the wall-structure region; and the memory device further includes a plurality of word line contacts formed in the finger adjacent to the wall-structure region to electrically connect the plurality of stairs; and within each of the first block and the second block, the plurality of GLSs extending along the first lateral direction further includes GLSs formed in each sub-intermediate region and between adjacent fingers, wherein:

along the first lateral direction, a length of a GLS formed in the sub-intermediate region and between adjacent fingers is shorter than or equal to the width of the sub-staircase structure.

\* \* \* \* \*